US012581827B2

(12) United States Patent
Kim et al.

(10) Patent No.: US 12,581,827 B2
(45) Date of Patent: *Mar. 17, 2026

(54) ORGANIC LIGHT EMITTING DISPLAY DEVICE

(71) Applicant: LG DISPLAY CO., LTD., Seoul (KR)

(72) Inventors: Seonghyun Kim, Paju-si (KR); Hojin Ryu, Paju-si (KR); Jaeki Lee, Paju-si (KR); Youngmu Oh, Paju-si (KR); Suphil Kim, Paju-si (KR); Jonghoon Yeo, Paju-si (KR); Jihoon Lee, Paju-si (KR); Changyong Gong, Paju-si (KR)

(73) Assignee: LG Display Co., Ltd. (KR)

( * ) Notice: Subject to any disclaimer, the term of this patent is extended or adjusted under 35 U.S.C. 154(b) by 598 days.

This patent is subject to a terminal disclaimer.

(21) Appl. No.: 18/087,860

(22) Filed: Dec. 23, 2022

(65) Prior Publication Data

US 2023/0135044 A1 May 4, 2023

Related U.S. Application Data

(62) Division of application No. 16/714,789, filed on Dec. 15, 2019, now Pat. No. 11,569,312.

(30) Foreign Application Priority Data

Dec. 24, 2018 (KR) .......................... 1020180168725

(51) Int. Cl.
*H10K 59/35* (2023.01)
*G09G 3/3266* (2016.01)
(Continued)

(52) U.S. Cl.
CPC ......... *H10K 59/352* (2023.02); *H10K 59/122* (2023.02); *H10K 59/35* (2023.02);
(Continued)

(58) Field of Classification Search
CPC .............. H10K 59/122; H10K 59/352; H10K 59/80515; H10K 59/80521
See application file for complete search history.

(56) References Cited

U.S. PATENT DOCUMENTS 8,730,560 B2 5/2014 Sonoda et al.
9,960,194 B1 5/2018 Park et al.
(Continued)

FOREIGN PATENT DOCUMENTS

CN 101578537 A 11/2009
CN 102445806 A 5/2012
(Continued)

OTHER PUBLICATIONS

Chinese Office Action dated Mar. 18, 2023 issued in Patent Application No. 201911291165.8 with English translation (20 pages).
(Continued)

*Primary Examiner* — Mary A Wilczewski
(74) *Attorney, Agent, or Firm* — Fish & Richardson P.C.

(57) ABSTRACT

An organic light-emitting display comprises a substrate having a plurality of subpixels arranged in a row direction and a column direction crossing the row direction; a plurality of first electrodes respectively allocated to the plurality of subpixels and comprising a first sub-electrode arranged in a (3n−2) column, a second sub-electrode arranged in a (3n−1) column, and a third sub-electrode arranged in a 3n column (where n is a natural number of 1 or more); and a bank having an opening exposing the plurality of first electrodes, wherein the first sub-electrode has a convex part protruded toward the third sub-electrode that has a concave part corresponding to the convex part.

6 Claims, 22 Drawing Sheets

(51) Int. Cl.

| | |
|---|---|
| *G09G 3/3275* | (2016.01) |
| *H10K 59/12* | (2023.01) |
| *H10K 59/122* | (2023.01) |
| *H10K 59/123* | (2023.01) |
| *H10K 59/126* | (2023.01) |
| *H10K 59/80* | (2023.01) |

(52) U.S. Cl.
CPC ..... *H10K 59/80515* (2023.02); *G09G 3/3266* (2013.01); *G09G 3/3275* (2013.01); *G09G 2310/08* (2013.01); *H10K 59/1201* (2023.02); *H10K 59/123* (2023.02); *H10K 59/126* (2023.02)

(56) References Cited

U.S. PATENT DOCUMENTS

| | | |
|---|---|---|
| 11,107,868 B2 | 8/2021 | Jeon et al. |
| 11,231,799 B2 | 1/2022 | Rhe et al. |
| 2012/0087003 A1 | 4/2012 | Sonoda et al. |
| 2013/0032802 A1 | 2/2013 | Kim et al. |
| 2015/0053948 A1 | 2/2015 | Matsushima |
| 2020/0176530 A1 | 6/2020 | Baek |
| 2020/0203448 A1 | 6/2020 | Kim et al. |
| 2020/0203449 A1 | 6/2020 | Jeon et al. |
| 2021/0104708 A1 | 4/2021 | Fukuoka |
| 2021/0175459 A1 | 6/2021 | Lee et al. |
| 2022/0157896 A1 | 5/2022 | Kim et al. |
| 2022/0173180 A1 | 6/2022 | Lee et al. |
| 2022/0208865 A1 | 6/2022 | Youn et al. |

FOREIGN PATENT DOCUMENTS

| | | |
|---|---|---|
| CN | 104916651 A | 9/2015 |
| CN | 104932137 A | 9/2015 |
| CN | 105047685 A | 11/2015 |
| CN | 106530971 A | 3/2017 |
| CN | 107068861 A | 8/2017 |
| CN | 11599942 A | 8/2020 |
| DE | 10 2018 131 756 A1 | 9/2019 |
| DE | 10 2019 134 173 A1 | 6/2020 |
| EP | 3 276 666 A1 | 1/2018 |
| JP | 2012-078746 A | 4/2012 |
| KR | 10-2003-0017696 A | 3/2003 |
| KR | 20160029996 A | 3/2016 |
| KR | 20160054720 A | 5/2016 |
| KR | 10-2016-0129932 A | 11/2016 |
| KR | 10-2017-0010172 A | 1/2017 |
| KR | 10-2018-0024314 A | 3/2018 |
| KR | 10-2018-0061777 A | 6/2018 |
| KR | 20210072465 A | 6/2021 |
| WO | 2013/118196 A1 | 8/2013 |
| WO | 2019/244288 A1 | 12/2019 |

OTHER PUBLICATIONS

Korean Office Action dated May 16, 2023 issued in Patent Application No. 10-2018-0168725 w/English Translation (14 pages).
Chinese Notice of Allowance dated Jan. 30, 2024 issued in Patent Application No. 201911291165.8 w/English Translation (9 pages).

(a)

(b)

ORGANIC LIGHT EMITTING DISPLAY DEVICE

CROSS REFERENCE TO RELATED APPLICATION

This application is a divisional of U.S. patent application Ser. No. 16/714,789, filed on Dec. 15, 2019, which claims priority from Korean Patent Application No. 10-2018-0168725, filed on Dec. 24, 2018, which are hereby incorporated by reference in their entirety for all purposes as if fully set forth herein.

BACKGROUND

Field of the Disclosure

The present disclosure relates to a display device, and more particularly, to an organic light-emitting display. Although the present disclosure is suitable for a wide scope of applications, it is particularly suitable for securing a dropping region of an organic light-emitting material while maintaining a preset area ratio between subpixels of the organic light-emitting display.

Description of the Background

Various display devices capable of reducing weight and volume, which is disadvantages of the cathode ray tube, are developed. Such display devices can be implemented as a liquid crystal display (LCD), a plasma display panel (PDP), a field emission display (FED), an organic light-emitting diode (OLED) display, etc.

An organic light-emitting display is a self-emission device without an additional light source, and has advantages in fast response time and high emission efficiency, high brightness and wide viewing angle. Furthermore, the organic light-emitting display can be implemented as a flexible display device because elements can be formed on a flexible substrate, such as plastic.

As large-area and high-resolution organic light-emitting displays are recently required, multiple subpixels are included in a single panel. In general, a mask is used for patterning red (R), green (G), and blue (B) subpixels. Accordingly, in order to implement a large-area display device, a corresponding large-area fine metal mask (FMM) is necessary. However, as the display device has a larger area, an organic light-emitting material to form an emission layer may not be deposited in place, which may be caused by the FMM drooping.

In order to solve such a problem in the above-described deposition method using the mask, a solution process (or soluble process) that is simple and advantageous for a large area attracts attention. The solution process enables large area patterning without a mask through inkjet printing or nozzle printing, and has a very high material use ratio of about 50 to 80% compared to the vacuum deposition having a material use ratio of 10% or less. Furthermore, the solution process provides excellent thermal stability and morphology characteristics because it has a higher glass transition temperature compared to a thin vacuum deposition film.

When an organic emission layer is formed with the solution process, a color mixture failure in which organic light-emitting materials of different colors are mixed may occur because the organic light-emitting materials may not be dropped in place. In order to prevent the color mixture failure, it is necessary to secure a sufficient dropping region of an organic light-emitting material is dropped by taking a process margin into consideration. In a high-resolution display device having a high pixel per inch (PPI), however, it is difficult to secure a dropping region because the size per pixel is very small.

SUMMARY

Accordingly, the present disclosure is directed to an organic light-emitting display that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

The present disclosure provides an organic light-emitting display capable of securing the dropping region of an organic light-emitting material while maintaining a preset area ratio between subpixels.

In an aspect, an organic light-emitting display includes a substrate, first electrodes, and a bank. The substrate has a plurality of subpixels arranged in a row direction and a column direction crossing the row direction. The first electrodes are allocated to the subpixels, respectively, and include (1-1) electrodes arranged in a (3n−2) (n is a natural number of 1 or more) column, (1-2) electrodes arranged in a (3n−1) column, and a (1-3) electrode arranged in a 3n column. The bank has an opening exposing the first electrodes. The (1-1) electrode includes a convex part protruded toward the (1-3) electrode. The (1-3) electrode comprises a concave part opposing the convex part.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principles of the disclosure. In the drawings.

DETAILED DESCRIPTION

Figure 1:
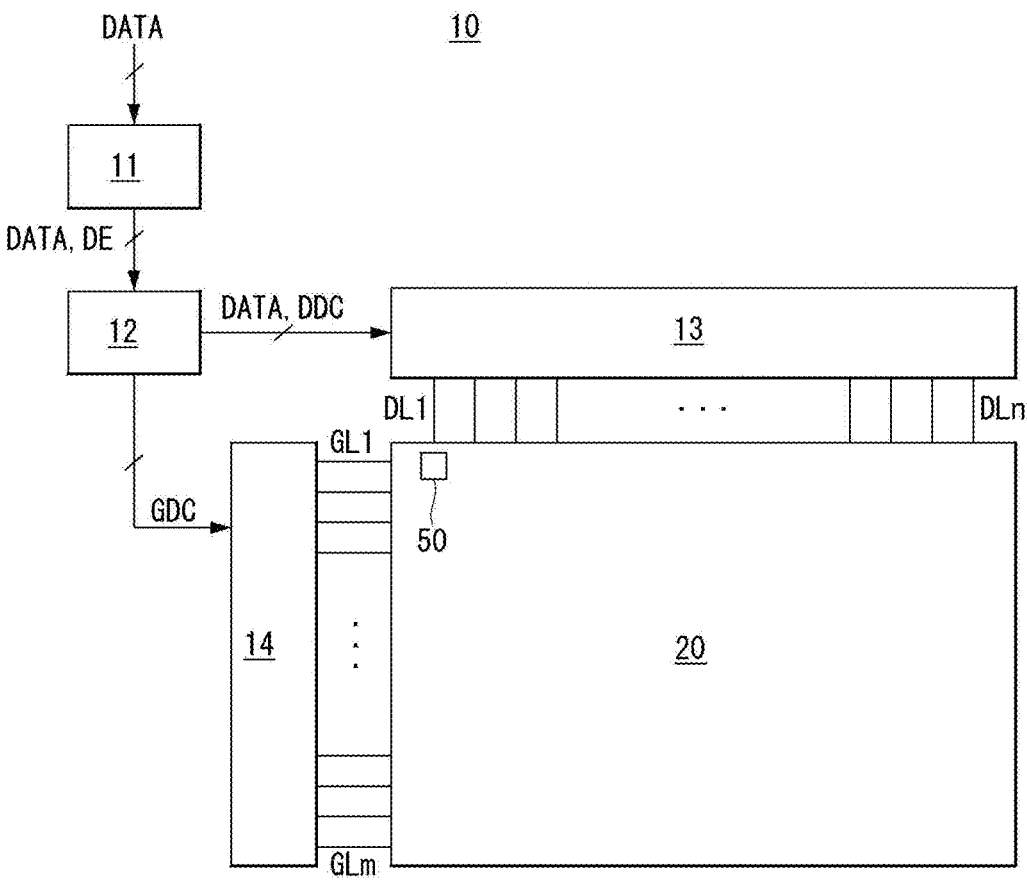
FIG. 1 is a schematic diagram of an organic light-emitting display device.

Hereinafter, aspects of the present disclosure are described with reference to the accompanying drawings. Throughout the specification, the same reference numeral substantially denotes the same element. In the following description, a detailed description of known technology or element related to the present disclosure will be omitted if it is deemed to make the gist of the present disclosure unnecessarily vague. In describing several aspects, the same element is representatively described at the introductory part of this specification, and may be omitted in other aspects.

Terms including ordinal numbers, such as the first and the second, may be used to describe various elements, but the elements are not limited by the terms. The terms are used to only distinguish one element from the other element.

Figure 2:
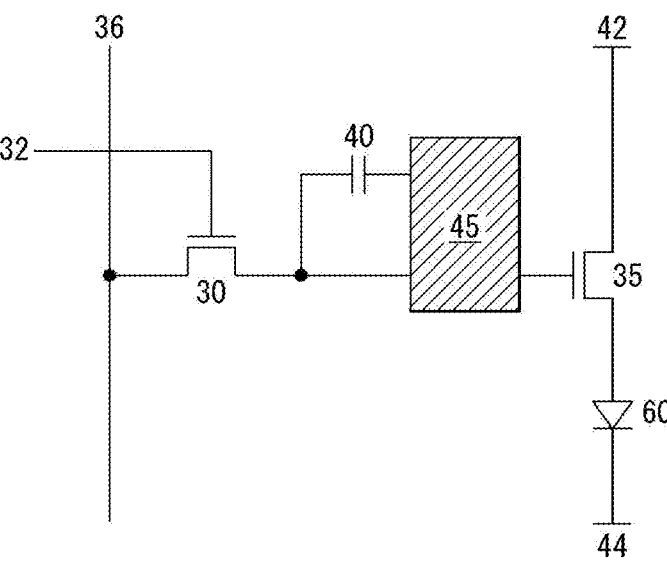
FIG. 2 is a schematic circuit diagram of a subpixel of the organic light-emitting display device.
Figure 3:
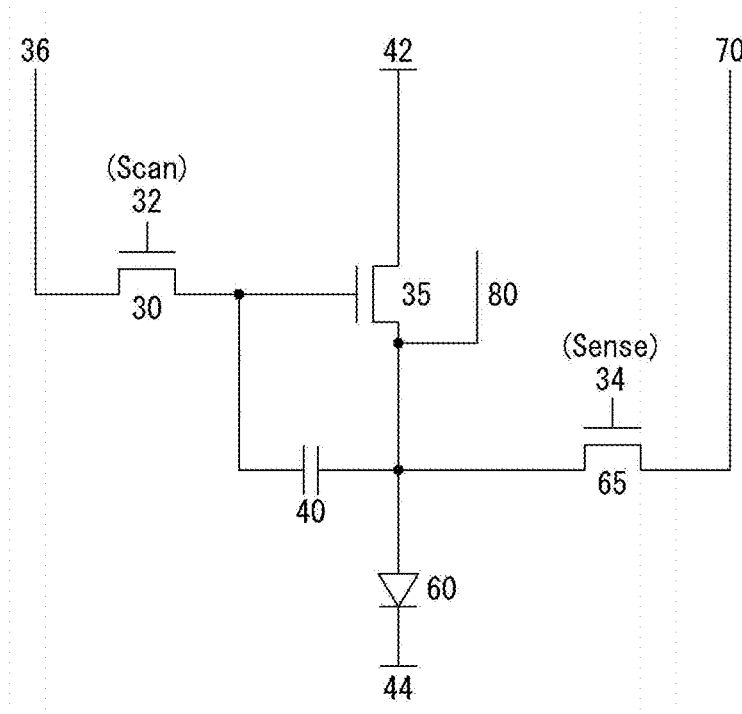
FIG. 3 is a detailed circuit diagram of the subpixel of the organic light-emitting display device.

FIG. 1 is a schematic diagram of an organic light-emitting display device. FIG. 2 is a schematic circuit diagram of a subpixel of the organic light-emitting display device. FIG. 3 is a detailed circuit diagram of the subpixel of the organic light-emitting display device.

As shown in FIG. 1, the organic light-emitting display device 10 includes an image processor 11, a timing controller 12, a data driver 13, a scan driver 14 and a display panel 20.

The image processor 11 outputs a data enable signal DE along with an externally supplied data signal DATA. The image processor 11 may output one or more of a vertical sync signal, a horizontal sync signal and a clock signal in addition to the data enable signal DE, but the signals are omitted, for convenience of description.

The timing controller 12 is supplied with the data signal DATA along with the data enable signal DE or driving signals, including the vertical sync signal, the horizontal sync signal and the clock signal, from the image processor 11. The timing controller 12 outputs a gate timing control signal GDC for controlling operating timing of the scan driver 14 and a data timing control signal DDC for controlling operating timing of the data driver 13 based on the driving signal.

The data driver 13 converts a data signal DATA, supplied by the timing controller 12, into a gamma reference voltage by sampling and latching the data signal DATA in response to a data timing control signal DDC supplied by the timing controller 12, and outputs the gamma reference voltage. The data driver 13 outputs the data signal DATA through data lines DL1~DLn. The data driver 13 may be formed in an integrated circuit (IC) form.

The scan driver 14 outputs a scan signal in response to a gate timing control signal GDC supplied by the timing controller 12. The scan driver 14 outputs the scan signal through gate lines GL1~GLm. The scan driver 14 is formed in an IC form or formed in the display panel 20 in a gate in panel (GIP) manner.

The display panel 20 displays an image in accordance with a data signal DATA and scan signal supplied by the data driver 13 and the scan driver 14. The display panel 20 includes subpixels 50 operating to display an image.

The subpixels 50 include a red subpixel, a green subpixel and a blue subpixel or include a white subpixel, a red subpixel, a green subpixel and a blue subpixel. The subpixels 50 may have one or more different emission regions depending on their emission characteristics.

As shown in FIG. 2, one subpixel includes a switching transistor 30, a driving transistor 35, a capacitor 40, a compensation circuit 45 and an organic light-emitting diode (OLED) 60.

The switching transistor 30 performs a switching operation in response to a scan signal supplied through a first gate line 32 so that a data signal supplied through a first data line 36 is stored in the capacitor 45 as a data voltage. The driving transistor 35 operates in response to a data voltage stored in the capacitor 45 so that a driving current flows between a power source line 42 (high potential voltage) and a cathode power source line 44 (low potential voltage). The OLED 60 operates to emit light in response to a driving current formed by the driving transistor 35.

The compensation circuit 45 is a circuit added within the subpixel in order to compensate for a threshold voltage of the driving transistor 35. The compensation circuit 45 is configured with one or more transistors. The configuration of the compensation circuit 45 is very various depending on an external compensation method, and an example thereof is described below.

As shown in FIG. 3, the compensation circuit 45 includes a sensing transistor 65 and a sensing line 70 (or reference line). The sensing transistor 65 is connected between the source electrode of the driving transistor 35 and the anode electrode (hereinafter referred to as "sensing node") of the OLED 60. The sensing transistor 65 operates to supply the sensing node of the driving transistor 35 with an initialization voltage (or sensing voltage) transferred through the sensing line 70 or to sense a voltage or current of the sensing node of the driving transistor 35 or the sensing line 70.

The switching transistor 30 has a first electrode connected to the first data line 36 and has a second electrode connected to the gate electrode of the driving transistor 35. The driving transistor 35 has a first electrode connected to the power source line 42 and has a second electrode connected to the anode electrode of the OLED 60. The capacitor 40 has a first electrode connected to the gate electrode of the driving transistor 35, and has a second electrode connected to the anode electrode of the OLED 60. The OLED 60 has the anode electrode connected to the second electrode of the driving transistor 35, and has a cathode electrode connected to the second power source line 44. The sensing transistor 65 has a first electrode connected to the sensing line 70, and has a second electrode connected to the anode electrode of the OLED 60, that is, a sensing node, and the second electrode of the driving transistor 35.

The operating time of the sensing transistor 65 may be similar/identical with or different from that of the switching transistor 30 depending on an external compensation algorithm (or the configuration of a compensation circuit). For example, the switching transistor 30 may have a gate electrode connected to a first gate line 32, and the sensing transistor 65 may have a gate electrode connected to a second gate line 34. In this case, a scan signal Scan is transferred to the first gate line 32, and a sensing signal Sense is transferred to the second gate line 34. For another example, the first gate line 32 connected to the gate electrode of the switching transistor 30 and the second gate line 34 connected to the gate electrode of the sensing transistor 65 may be connected to be shared.

The sensing line 70 may be connected to a data driver. In this case, the data driver may sense the sensing node of a subpixel during the non-display period or N frame (N is an integer of 1 or more) period of a real-time image, and may generate a result of the sensing. The switching transistor 30 and the sensing transistor 65 may be turned on at the same time. In this case, a sensing operation through the sensing line 70 based on a time-division method of the data driver and a data output operation of outputting a data signal are separated.

In addition, a compensation target according to a result of the sensing may be a data signal of a digital form, a data signal of an analog form or gamma. Furthermore, the compensation circuit generating a compensation signal (or compensation voltage) based on a result of the sensing may be implemented within the data driver, within the timing controller or as a separate circuit.

A light blocking layer 80 may be positioned only under the channel region of the driving transistor 35 or may be positioned under the channel region of the switching transistor 30 and the sensing transistor 65 in addition to the driving transistor 35. The light blocking layer 80 may be used to simply block external light or may be used as an electrode that connects the light blocking layer 80 and a different electrode or line or configures a capacitor. Accordingly, the light blocking layer 80 is selected as the metal layer of plural layers (e.g., plural layers of heterogeneous metals) to have a light-shielding characteristic.

In addition, FIG. 3 has been illustrated as being a subpixel having a 3transistor (T) (capacitor (C) (3T1C) structure, including the switching transistor 30, the driving transistor 35, the capacitor 40, the OLED 60, and the sensing transistor 65. If the compensation circuit 45 is added, a subpixel may have a structure of 3T2C, 4T2C, 5T1C or 6T2C.

Figure 4:
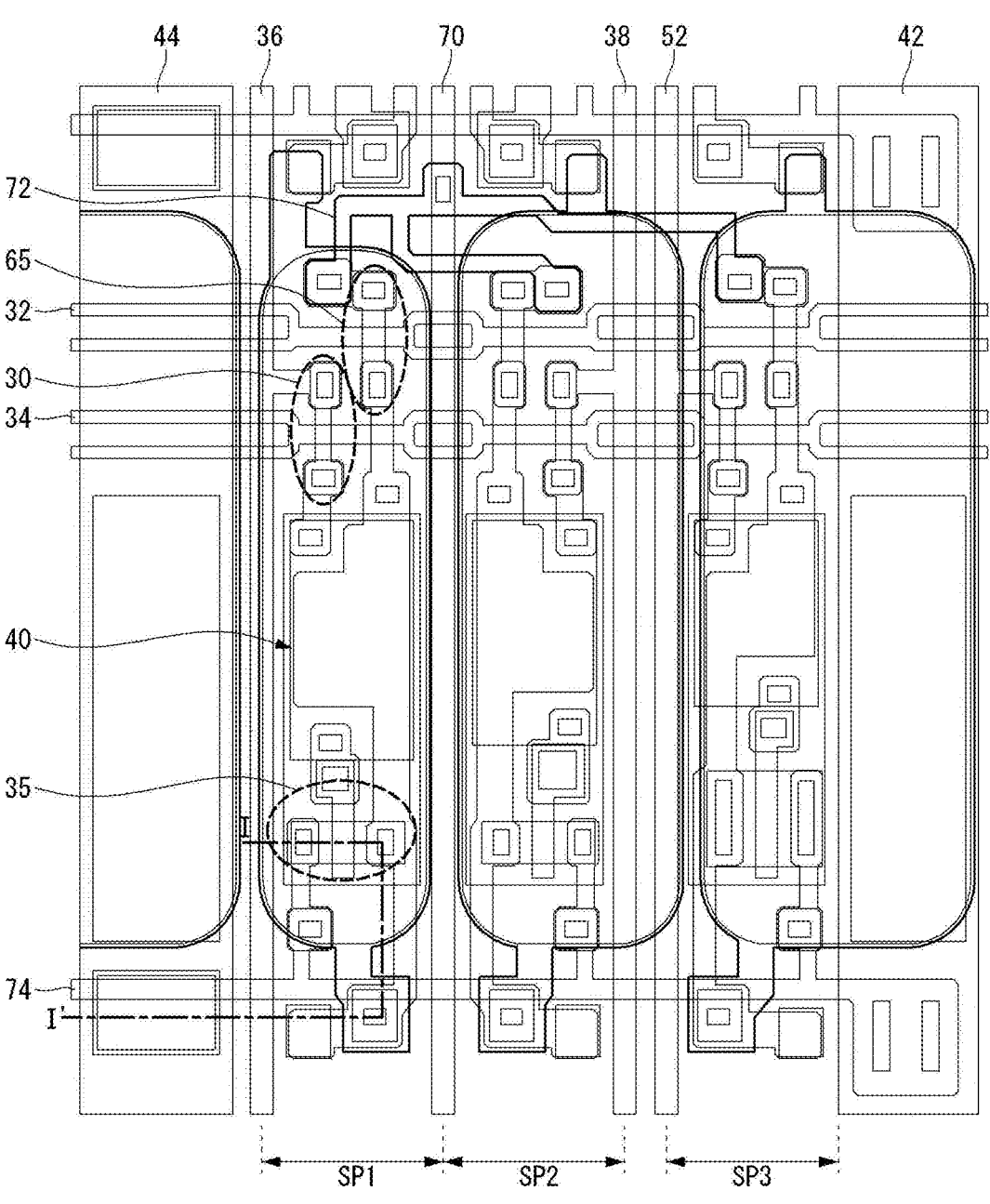
FIG. 4 a plan view schematically showing a layout of subpixels according to an aspect of the present disclosure.
Figure 5:
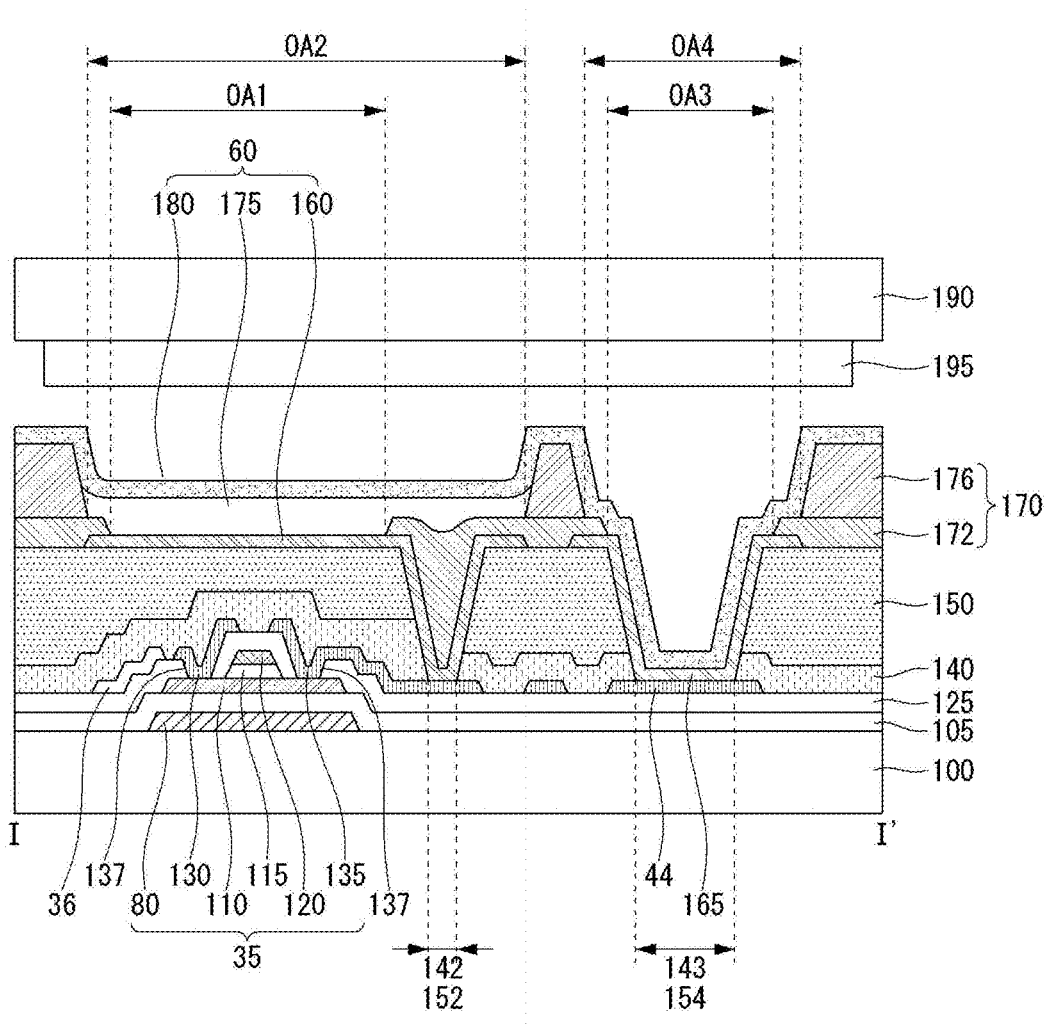
FIG. 5 is a cross-sectional view taken along dotted line I-I' of FIG. 4.

FIG. 4 schematically shows a plan layout of subpixels according to the present disclosure. FIG. 5 is a cross-sectional view taken along dotted line I-I' of FIG. 4.

Referring to FIG. 4, a first subpixel SP1, a second subpixel SP2 and a third subpixel SP3 are formed on the display region of a substrate. An OLED (light-emitting device) and a circuit, including the switching transistor 30, the sensing transistor 65 and the driving transistor 35 driving the OLED, are formed in each of the first subpixel SP1, the second subpixel SP2 and the third subpixel SP3. The OLEDs of the first subpixel SP1, second subpixel SP2 and third subpixel SP3 emit light in accordance with operations of the switching transistor 30, sensing transistor 65 and driving transistor 35, respectively. A power source line 42, a sensing line 70, and first to third data lines 36, 38, and 52 are disposed between the first subpixel SP1, the second subpixel SP2 and the third subpixel SP3. First and second gate lines 32 and 34 are disposed to traverse the first subpixel SP1, the second subpixel SP2 and the third subpixel SP3.

Wires, such as the power source line 42, the sensing line 70, the first to the third data lines 36, 38, and 52, and electrodes configuring a thin film transistor (TFT) are disposed in different layers, but are electrically connected due to a contact through a contact hole (or via hole). The sensing line 70 is connected to the sensing transistor 65 of each of the first subpixel SP1, second subpixel SP2 and third subpixel SP3 through a sensing connection line 72. The power source line 42 is connected to the driving transistor 35 of each of the first subpixel SP1, second subpixel SP2 and third subpixel SP3 through a power source connection line 74.

The first and the second gate lines 32 and 34 are connected to the sensing and switching transistors 65 and 30 of each of the first subpixel SP1, second subpixel SP2 and third subpixel SP3.

The first subpixel SP1 may be a red subpixel, the second subpixel SP2 may be a green subpixel, and the third subpixel SP3 may be a blue subpixel. However, the positions of the subpixels may be changed.

A cross-sectional structure of the first subpixel of the first to the third subpixels is described below as an example with reference to FIG. 5.

Referring to FIG. 5, a light blocking layer 80 is positioned on a substrate 100. The light blocking layer 80 functions to prevent a photocurrent from occurring in a transistor by blocking the incidence of external light. A buffer layer 105 is positioned on the light blocking layer 80. The buffer layer 105 functions to protect a transistor, formed in a subsequent process, against impurities such as alkali ions drained from the light blocking layer 80. The buffer layer 105 may be a silicon oxide (SiOx) layer, a silicon nitride (SiNx) layer or a multiple layer of them.

The semiconductor layer 110 of a driving transistor 35 is positioned on the buffer layer 105. The semiconductor layer 110 may be made of a silicon semiconductor, an oxide semiconductor or an organic matter semiconductor. The silicon semiconductor may be formed using amorphous silicon or using polycrystalline silicon crystallized from amorphous silicon. The oxide semiconductor may be made of any one of zinc oxide (ZnO), indium zinc oxide (InZnO), indium gallium zinc oxide (InGaZnO) or zinc tin oxide (ZnSnO). The organic matter semiconductor may be made of a small molecule or polymetric molecule organic matter, such as merocyanine, phthalocyanine, pentacene and thiophenpolymer. The semiconductor layer 110 includes a drain region and source region including p or n type impurities, and includes a channel between the drain region and the source region.

A gate insulating film 115 is positioned on the semiconductor layer 110. The gate insulating film 115 may be a silicon oxide (SiOx) layer, a silicon nitride (SiNx) layer or a multiple layer of them. A gate electrode 120 is positioned on the gate insulating film 115 in a given region of the semiconductor layer 110, that is, a position corresponding to a channel if impurities have been implanted. The gate electrode 120 may be formed of one of molybdenum (Mo), aluminum (Al), chrome (Cr), gold (Au), titanium (Ti), nickel (Ni), neodymium (Nd) and copper (Cu) or an alloy of them. Furthermore, the gate electrode 120 may be a multiple layer of one of molybdenum (Mo), aluminum (Al), chrome (Cr), gold (Au), titanium (Ti), nickel (Ni), neodymium (Nd) and copper (Cu) or an alloy of them. For example, the gate electrode 120 may be a dual layer of made of molybdenum/aluminum-neodymium or molybdenum/aluminum.

An interlayer dielectric film 125 for insulating the gate electrode 120 is positioned on the gate electrode 120. The interlayer dielectric film 125 may be a silicon oxide (SiOx) film, a silicon nitride (SiNx) film or a multiple layer of them. A source electrode 130 and a drain electrode 135 are disposed on the interlayer dielectric film 125. The source electrode 130 and the drain electrode 135 are connected to the semiconductor layer 110 through contact holes 137, respectively, exposing the source and drain regions of the semiconductor layer 110. The source electrode 130 and the drain electrode 135 may be configured with a single layer or a multiple layer. If the source electrode 130 and the drain electrode 135 are configured with a single layer, they may be one of molybdenum (Mo), aluminum (Al), chrome (Cr), gold (Au), titanium (Ti), nickel (Ni), neodymium (Nd) and copper (Cu) or an alloy of them. Furthermore, if the source electrode 130 and the drain electrode 135 are configured with a multiple layer, they may be a dual layer of molybdenum/aluminum-neodymium or a triple layer of titanium/aluminum/titanium, molybdenum/aluminum/molybdenum or molybdenum/aluminum-neodymium/molybdenum. A first data line 36 is positioned in the region separated from the driving transistor 35, and a cathode power source line 44 is positioned in a different region.

Accordingly, the driving transistor 35, including the semiconductor layer 110, the gate electrode 120, the source electrode 130 and the drain electrode 135, is configured.

A passivation film 140 is positioned on the substrate 100 including the driving transistor 35. The passivation film 140 is an insulating film protecting an underlying element, and may be a silicon oxide (SiOx) film, a silicon nitride (SiNx) film or a multiple layer of them. A first via hole 142 exposing the drain electrode 135 of the underlying driving transistor 35 is positioned in some region of the passivation film 140. A second via hole 143 exposing the cathode power source line 44 is positioned in some region of the passivation film 140.

An overcoat layer 150 is positioned on the passivation film 140. The overcoat layer 150 may be a planarization film for reducing the step of a lower structure, and is made of an organic matter, such as polyimide, benzocyclobutene series resin or acrylate. A third via hole 152 exposing the drain electrode 135 by exposing the first via hole 142 of the passivation film 140 is positioned in some region of the overcoat layer 150. A fourth via hole 154 exposing the cathode power source line 44 by exposing the second via hole 143 of the passivation film 140 is positioned in some region of the overcoat layer 150.

An OLED 60 is formed on the overcoat layer 150. The OLED 60 includes a first electrode 160 connected to the driving transistor 35, a second electrode 180 opposite the first electrode 160, and an organic emission layer 175 interposed between the first electrode 160 and the second electrode 180. The first electrode 160 may be an anode electrode, and the second electrode 180 may be a cathode electrode.

The first electrode 160 is positioned on the overcoat layer 150, and may be connected to the drain electrode 135 of the driving transistor 35 through the third via hole 152 of the overcoat layer 150 and the first via hole 142 of the passivation film 140. One first electrode 160 may be allocated to each subpixel, but the present disclosure is not limited thereto. The first electrode 160 may be made of a transparent conductive material, such as indium tin oxide (ITO), indium zinc oxide (ZTO) or zinc oxide (ZnO), to function as a transmission electrode or may include a reflection layer to function as a reflection electrode, in accordance with an adopted emission method. The reflection layer may be made of aluminum (Al), copper (Cu), silver (Ag), nickel (Ni) or an alloy of them and may be made of a silver/palladium/copper (APC) alloy.

A connection pattern 165 connected to the cathode power source line 44 through the fourth via hole 154 of the overcoat layer 150 and the second via hole 143 of the passivation film 140 is positioned on the overcoat layer 150 separated from the first electrode 160. The connection pattern 165 has the same structure as the first electrode 160.

A bank 170 is positioned on the substrate 100 in which the first electrode 160 has been formed. The bank 170 includes a first bank 172 having a first opening OA1 exposing the first electrode 160. The bank 170 includes the second bank 176 having a second opening OA2. The second opening OA2 has a larger area than the first opening OA1, and may expose a part of the first bank 172.

Furthermore, a first bank 172 includes a third opening OA3 exposing the connection pattern 165. A second bank 176 includes a fourth opening OA4 exposing the part of the first bank 172 and the connection pattern 165. The fourth opening OA4 has a larger area than the third opening OA3, and may expose the part of the first bank 172.

An organic emission layer 175 is positioned on the substrate 100 in which the bank 170 has been formed. The organic emission layer 175 includes an emission layer (EL), and may further include any one or more of a hole injection layer (HIL), a hole transport layer (HTL), an electron transport layer (ETL) and an electron injection layer (EIL). The organic emission layer 175 is coated and dried by a solution process (or, soluble process), such as inkjet printing or nozzle coating, thus the top of the organic emission layer 175 with which the organic emission layer 175 and the bank 170 come into contact may have a round shape.

The second electrode 180 is positioned on the organic emission layer 175. The second electrode 180 may be widely formed on the entire surface of the substrate 100. The second electrode 180 may function as a transmission electrode or a reflection electrode in accordance with an adopted emission method. If the second electrode 180 is a transmission electrode, it may be made of a transparent conductive material, such as indium tin oxide (ITO) or indium zinc oxide (ZTO) or may be made of magnesium (Mg), calcium (Ca), aluminum (Al), silver (Ag) or an alloy of them having a thin thickness through which light can transmit. The second electrode 180 is connected to the connection pattern 165 through the third opening OA3 of the first bank 172 and the fourth opening OA4 of the second bank 176, thus being connected to the cathode power source line 44.

An opposite substrate 190 opposite the substrate 100 in which the driving transistor 35 and the OLED 60 have been formed is positioned. The opposite substrate 190 seals the substrate 100, and includes a color filter 195 at the bottom thereof. The color filter 195 may be a red color filter, and functions to make thick red color coordinates. For example, if a first subpixel is a red subpixel, the opposite substrate 190 may have a red color filter in the region corresponding to the first subpixel. Furthermore, any color filter may not be provided in a region that belongs to the opposite substrate 190 and that corresponds to a second subpixel, that is, a green subpixel, and a third subpixel, which is, a blue subpixel. However, such examples are merely examples, and a color filter of a corresponding color may be provided in each subpixel. The structure of FIG. 5 may be identically applied to other subpixels in addition to the above-described subpixel.

Hereinafter, there is proposed a new structure capable of securing the area of a dropping region while securing a preset area ratio between subpixels.

Figure 6:
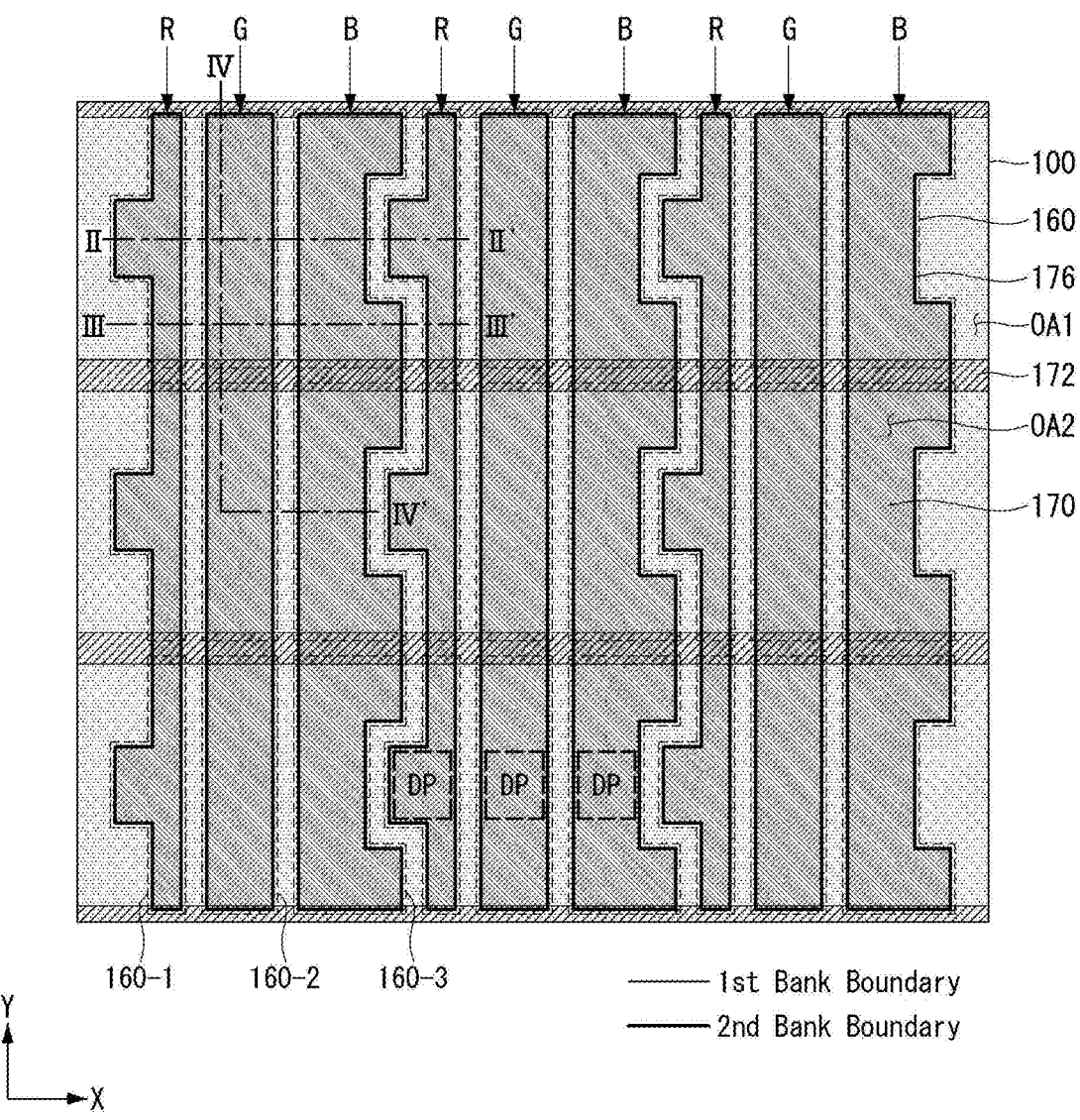
FIG. 6 is a plan view schematically showing a display device according to the present disclosure.
Figure 7:
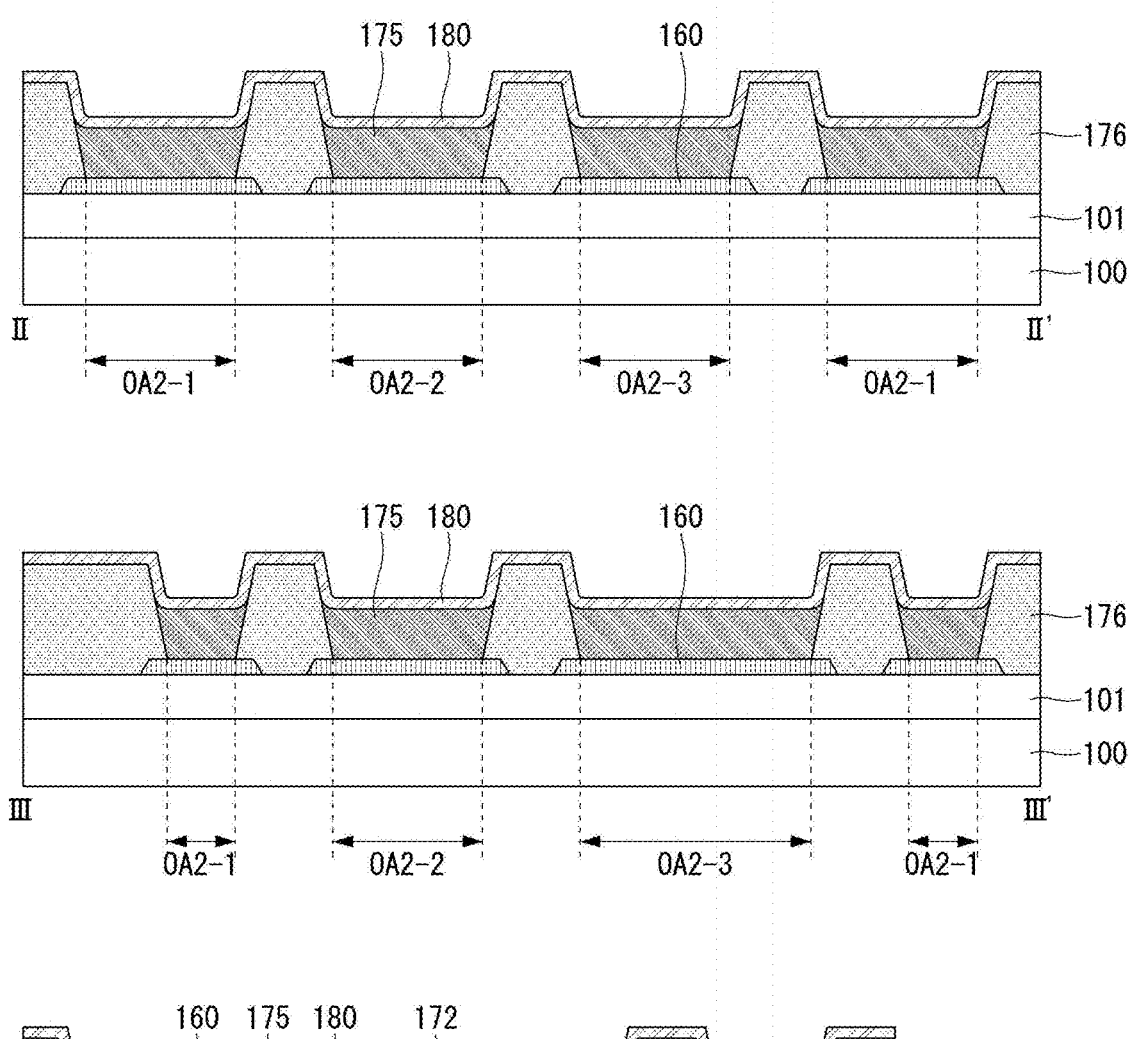
FIG. 7 shows cross-sectional views taken along lines II-II', III-III', and IV-IV' of FIG. 6.
Figure 7:
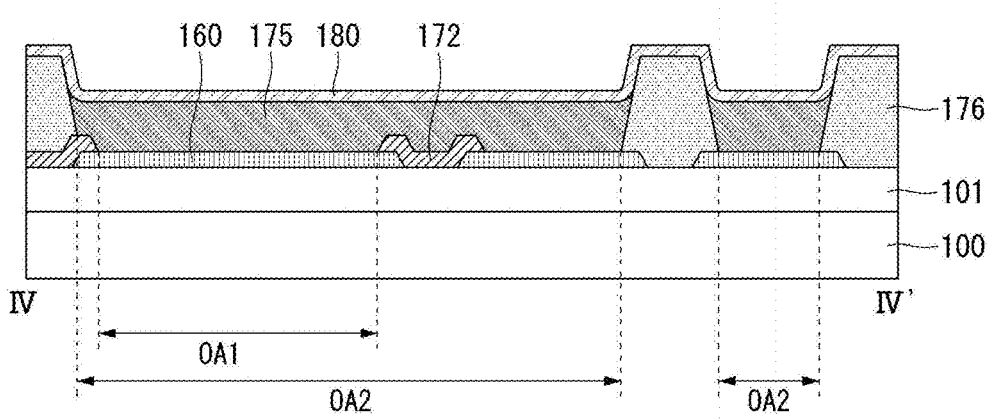
Figure 8:
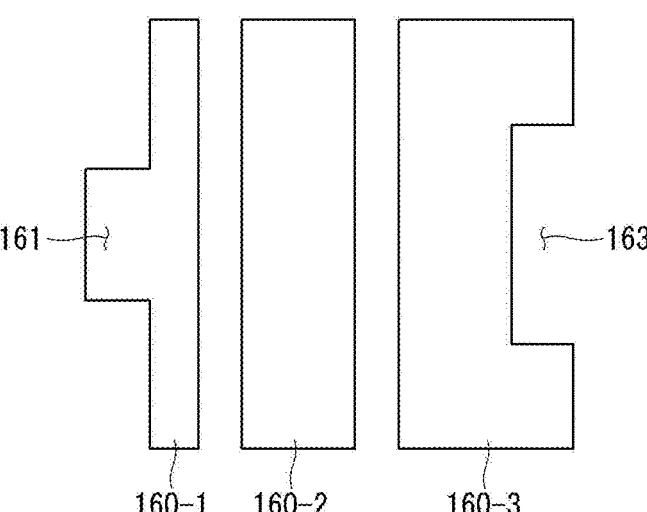
FIG. 8 is a schematic diagram for illustrating the shape and position relation of first electrodes.

FIG. 6 is a plan view schematically showing a display device according to an aspect of the present disclosure. FIG. 7 shows cross-sectional views taken along lines III-III', and IV-IV' of FIG. 6. FIG. 8 is a diagram for illustrating the shape and position relation of first electrodes.

Referring to FIGS. 6 and 7, the display device according to the present disclosure includes a substrate 100 in which subpixels SP have been arranged. A circuit element layer 101 and an OLED 60 driven by the elements of the circuit element layer 101 are disposed on the substrate 100.

A signal line for applying a driving signal to the OLED 60 and electrodes may be arranged in the circuit element layer 101. The signal line and electrodes may be separated with at least one insulating layer interposed therebetween if necessary. If the organic light-emitting display is implemented by an active matrix (AM) method, the circuit element layer 101 may further include a transistor allocated to each subpixel SP. In this case, the subpixel SP may have a structure, such as that shown in FIG. 5, but is not limited thereto.

The OLED 60 includes a first electrode 160, a second electrode 180, and an organic emission layer 175 interposed between the first electrode 160 and the second electrode 180. The first electrode 160 may be an anode, and the second electrode 180 may be a cathode.

More specifically, the subpixels SP are arranged in a row direction (e.g., X-axis direction) and a column direction (e.g., Y-axis direction) which cross each other. Subpixels SP adjacently arranged in the row direction may emit light of different colors, and subpixels SP adjacently arranged in the column direction may emit light of the same color.

The subpixels include a first subpixel in a (3n−2) (n is a natural number of 1 or more) column, a second subpixel arranged in a (3n−1) column, and a third subpixel arranged in a 3n column. That is, the first subpixel, second subpixel and third subpixel are sequentially arranged alternately in the row direction. The first subpixel may emit light of a first color. The second subpixel may emit light of a second color. The third subpixel may emit light of a third color. The first color may be red, the second color may be green, and the third color may be blue, but are not limited thereto.

The first electrode 160 of the OLED 60 is positioned in the subpixel SP. One first electrode 160 may be allocated to one subpixel SP. Adjacent first electrodes 160 are spaced apart at predetermined intervals.

The first electrodes 160 include a (1-1) electrode 160-1, a (1-2) electrode 160-2, and a (1-3) electrode 160-3. The (1-1) electrode 160-1, (1-2) electrode 160-2, and (1-3) electrode 160-3 have different plane shapes. The (1-1) electrode 160-1 may be allocated to the first subpixel, the (1-2) electrode 160-2 may be allocated to the second subpixel, and the (1-3) electrode 160-3 may be allocated to the third subpixel.

The (1-1) electrodes 160-1 are disposed in the (3n−2) column. The (1-1) electrodes 160-1 are sequentially disposed in the column direction. The (1-2) electrodes 160-2 are disposed in the (3n−1) column. The (1-2) electrodes 160-2 are sequentially disposed in the column direction. The (1-3) electrodes 160-3 are disposed in the 3n column. The (1-3) electrodes 160-3 are sequentially disposed in the column direction. Accordingly, the (1-1) electrode 160-1, (1-2) electrode 160-2, and (1-3) electrode 160-3 are sequentially disposed alternately in the row direction.

Referring further to FIG. 8, the (1-1) electrode 160-1 has a convex part 161 on its one side. The convex part 161 may be disposed on one side of the (1-1) electrode 160-1 not adjacent to the (1-2) electrode 160-2. The convex part 161 may be positioned on one side of the (1-1) electrode 160-1 adjacent to the (1-3) electrode 160-3. The area of the region in which the convex part 161 of the (1-1) electrode 160-1 has been formed has a wide area compared to other regions. The convex part 161 may be protruded toward the (1-3) electrode 160-3 in a region adjacent to the (1-3) electrode 160-3.

The (1-2) electrode 160-2 may have a square or an oblong.

The (1-3) electrode 160-3 has a concave part 163 on its one side. The concave part 163 may be positioned on one side of the (1-3) electrode 160-3 not adjacent to the (1-2) electrode 160-2. The concave part 163 may be positioned on one side of the (1-1) electrode 160-1 adjacent to the (1-1) electrode 160-1. In the region in which the (1-1) electrode 160-1 and the (1-3) electrode 160-3 are adjacently disposed, the convex part 161 of the (1-1) electrode 160-1 is opposite the concave part 163 of the (1-3) electrode 160-3. In the region in which the (1-1) electrode 160-1 and the (1-3) electrode 160-3 are adjacently disposed, the convex part 161 of the (1-1) electrode 160-1 may be inserted in the concave part 163 of the (1-3) electrode 160-3.

A bank 170 is positioned on the substrate 100 in which the first electrode 160 has been formed. The bank 170 includes a first bank 172 and a second bank 176.

The first bank 172 includes a first opening OA1 exposing at least one part of the first electrode 160. The first bank 172 may be positioned to cover one side of the first electrodes 160 between first electrodes 160 adjacent in the column direction.

A plurality of the first openings OA1 is arranged in parallel in the column direction. Each of the first openings OA1 is extended in the row direction, thus exposing the (1-1) electrode 160-1, (1-2) electrode 160-2, and (1-3) electrodes 160-3 disposed in the row direction together. In other words, the first bank 172 may be positioned between first electrodes 160 adjacent in the column direction, and may partition subpixels SP adjacent in the column direction. That is, the first bank 172 may be positioned between (1-1) electrodes 160-1, between (1-2) electrodes 160-2, and between (1-3) electrodes 160-3 adjacent in the column direction.

The first bank 172 may be formed in a relatively thin thickness so that it is covered by the organic emission layer 175 to be formed subsequently. The first bank 172 may have a hydrophilic property. For example, the first bank 172 may be made of a hydrophilic inorganic insulating material, such as silicon oxide ($SiO_2$) or silicon nitride ($SiN_x$). The first bank 172 is a thin film of a hydrophilic component provided to prevent a wettability failure attributable to the hydrophobic property of the first electrode 160, and functions to well spread an organic light-emitting material having the hydrophilic property.

The second bank 176 is positioned on the substrate 100 in which the first bank 172 has been formed. The second bank 176 includes a second opening OA2 exposing at least one part of the first electrode 160. A plurality of the second openings OA2 is disposed in parallel in the row direction and extended in the column direction. The second opening OA2 is extended in the column direction, thus exposing the plurality of first electrodes 160 disposed in the column direction. The width of the second bank 176 may be selected as a minimum width, which is configured so that organic light-emitting materials of different colors dropped to adjacent second openings OA2 are not mixed and which is possible in process.

More specifically, the second bank 176 is positioned between (1-1) electrodes 160-1 arranged in the (3n−2) column and (1-2) electrodes 160-2 which are arranged in the (3n−1) column and are adjacent to the (1-1) electrodes 160-1. That is, subpixels arranged in the (3n−2) column and subpixels arranged in the (3n−1) column may be partitioned by the second bank 176. In this case, the second bank 176 may be extended in the column direction in a straight-line form between the (1-1) electrodes 160-1 arranged in the (3n−2) column and the (1-2) electrodes 160-2 arranged in the (3n−1) column.

The second bank 176 is positioned between (1-2) electrodes 160-2 arranged in the (3n−1) column and (1-3) electrodes 160-3 which are arranged in the 3n column and are adjacent to the (1-2) electrodes 160-2. That is, subpixels arranged in the (3n−1) column and subpixels arranged in the 3n column may be partitioned by the second bank 176. In this case, the second bank 176 may be extended in the column direction in a straight-line form between the (1-2) electrodes 160-2 arranged in the (3n-1) column and the (1-3) electrodes 160-3 arranged in the 3n column.

The second bank 176 is positioned between (1-3) electrodes 160-3 arranged in the 3n column and (1-1) electrodes 160-1 which are arranged in the (3n-2) column and are adjacent to the (1-3) electrodes 160-3 in the row direction. That is, subpixels arranged in the 3n column and subpixels arranged in the (3n-2) column may be partitioned by the second bank 176. In this case, the second bank 176 may be extended in the column direction in zigzag form between the (1-3) electrodes 160-3 arranged in the 3n column and the (1-1) electrodes 160-1 arranged in the (3n-2) column.

A (2-1) opening OA2-1 exposing the (1-1) electrodes 160-1 arranged in the (3n-2) column, a (2-2) opening OA2-2 exposing the (1-2) electrodes 160-2 arranged in the (3n-1) column, and (2-3) openings OA2-3 exposing the (1-3) electrodes 160-3 arranged in the 3n column have different areas and shapes.

A part that belongs to the (2-1) opening OA2-1 and that exposes the convex parts 161 of the (1-1) electrodes 160-1 may be configured to have a relatively wide width compared to a part exposing other parts of the (1-1) electrodes 160-1. Accordingly, a part of the (2-1) opening OA2-1 exposing the convex part 161 can satisfy a minimum width which may be set by taking into consideration the amount of dropping of an organic light-emitting material and a process margin. In this case, a part of the (2-1) opening OA2-1 exposing the (1-1) electrode 160-1 may be assigned as a dropping region DP to which an organic light-emitting material is dropped upon performing a solution process.

In this case, the (2-3) opening OA2-3 may be configured to have a relatively narrow width in the region, corresponding to the concave part 163, compared to other regions. However, the (2-3) opening OA2-3 basically has been configured to have a greater width than the (2-1) opening OA2-1. Accordingly, in the region in which the concave part 163 has been formed, the second opening OA2 exposing the (1-3) electrode 160-3 can satisfy a minimum width which may be set by taking into consideration the amount of dropping of an organic light-emitting material and a process margin. In this case, a part of the (2-3) opening OA2-3 corresponding to the concave part 163 may be assigned as a region DP to which an organic light-emitting material upon performing a solution process. Furthermore, the (2-3) opening OA2-3 has a sufficient width in the region in which the concave part 163 has not been formed. Accordingly, the region in which the concave part 163 has not been formed may also be allocated as the region to which an organic light-emitting material is dropped.

A part of the first electrode 160 exposed by a combination structure of the first bank 172 and the second bank 176 may be defined as an emission region. The plane shape of the emission region may correspond to that of the first electrode 160. An emission region allocated to each of the first subpixels arranged in the (3n-2) column, an emission region allocated to each of the second subpixels arranged in the (3n-1) column, and an emission region allocated to each of the third subpixels arranged in the (3n-2) column have different areas and shapes.

The second bank 176 may have a hydrophobic property. Alternatively, the top of the second bank 176 may have a hydrophobic property, and the lateral part thereof may have a hydrophilic property. For example, the second bank 176 may have a form in which a material of a hydrophobic property has been coated on an insulating material, and may be formed using the insulating material containing a hydrophobic material. The second bank may be made of an organic material. The hydrophobic property of the second bank 176 may function to push an organic light-emitting material configuring the organic emission layer 175 so that the organic light-emitting material gathers at the central part of the emission region. Furthermore, the second bank 176 may function as a barrier to confine an organic light-emitting material, dropped to a corresponding region, in order to prevent organic light-emitting materials of different colors from being mixed. That is, the second bank 176 functions to prevent organic light-emitting materials of different colors dropped to the second openings OA2 adjacent in the row direction, respectively, from being mixed.

The organic emission layer 175 is positioned on the substrate 100 in which the second bank 176 has been formed. The organic emission layer 175 may be formed in the direction in which a corresponding second opening OA2 has been extended within the second opening OA2. That is, an organic light-emitting material dropped to one second opening OA2 covers the first electrodes 160 and the first banks 172 exposed by the second opening OA2. After a curing process, the organic emission layer 175 formed within the second opening OA2 is not physically separated by the first bank 172 ad maintains continuity on the first bank 172.

Organic light-emitting materials having the same color are dropped to a plurality of first electrodes 160 exposed by one second opening OA2. This means that light of the same color is emitted from a plurality of subpixels SP allocated to positions corresponding to the one second opening OA2. The plane shape of the organic emission layer 175 may correspond to that of the second opening OA2.

Organic light-emitting materials having different colors may be sequentially dropped to respective second openings OA2 alternately. The organic light-emitting materials of different colors may include organic light-emitting materials emitting light of red (R), green (G), and blue (B). The organic emission layers 175 emitting light of different colors are physically separated by the second bank 176.

According to an aspect of the present disclosure, a thickness irregularity phenomenon attributable to a pile-up phenomenon after curing can be improved because an organic light-emitting material can be spread in a uniform thickness in a wide region on the second opening OA2 extended in the column direction. Accordingly, the organic light-emitting display according to an aspect of the present disclosure can prevent a reduction in the uniformity of the organic emission layer 175 because it can reduce display quality degradation attributable to a thickness deviation within a subpixel SP. Furthermore, the organic light-emitting display can prevent a failure, such as a reduction in the lifespan of a device or the occurrence of a dark point, because the uniformity of the organic emission layer 175 is secured.

Furthermore, as described above, the organic light-emitting display according to an aspect of the present disclosure has an advantage in that it can significantly improve display quality degradation attributable to a color mixture failure because the dropping region of an organic light-emitting material can be sufficiently secured.

Figure 9:
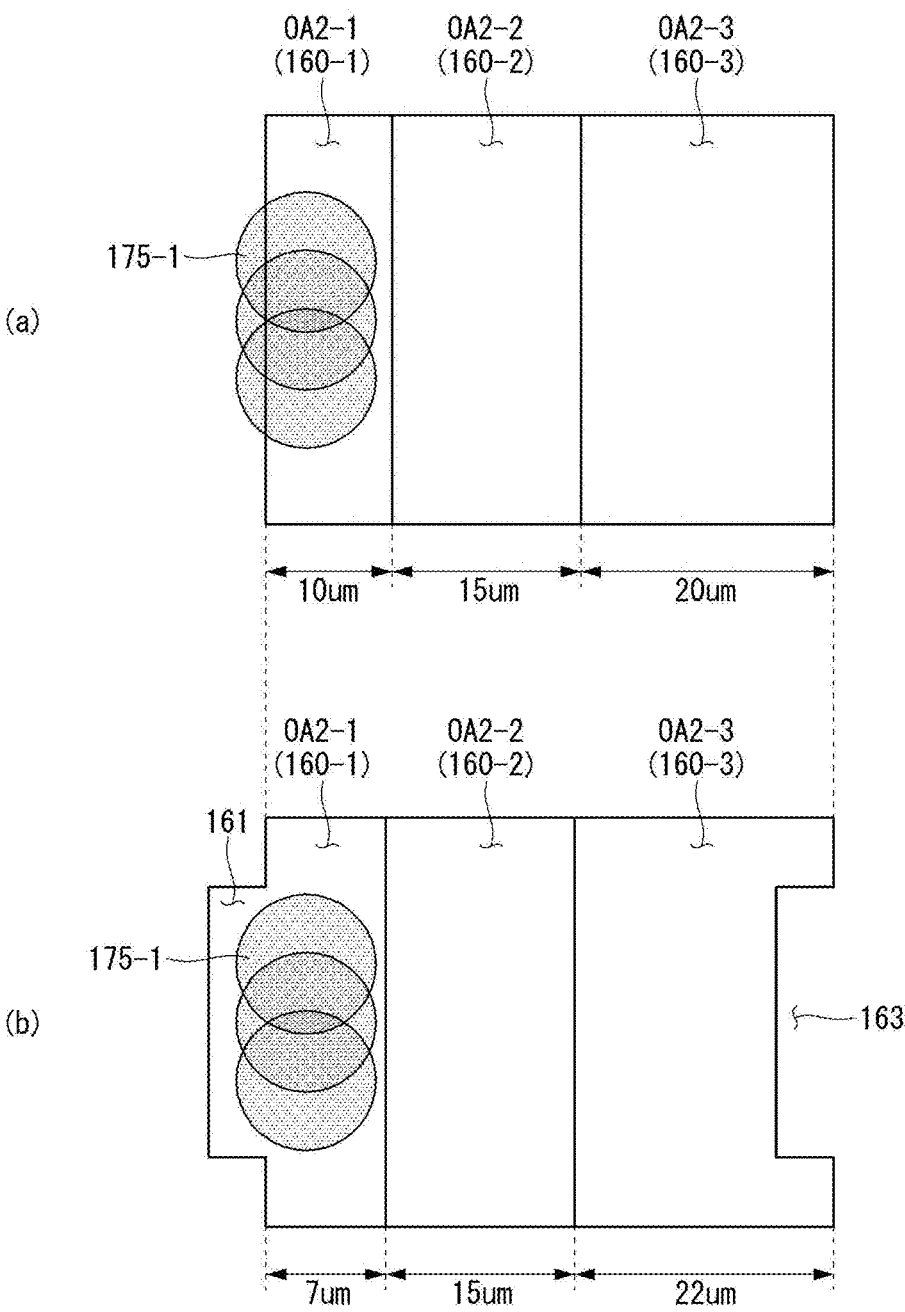
FIG. 9 is a schematic diagram for illustrating an effect of the present disclosure.

FIG. 9 is a diagram for illustrating an effect of the present disclosure.

FIG. 9(a) shows a subpixel structure according to a comparison example, and FIG. 9(b) shows a subpixel structure according to an aspect of the present disclosure. Numerical values shown in the drawings have been illustrated to help easy understanding of a change in the width, but the present disclosure is not limited thereto.

If the organic emission layer is formed using a solution process, a color mixture failure in which organic light-emitting materials 175-1 of different colors are mixed because the organic light-emitting materials 175-1 are not dropped in place may occur. In order to prevent the color mixture failure, it is necessary to secure a sufficient dropping region of the organic light-emitting material 175-1 by taking a process margin into consideration. That is, the width of the second opening OA2 to which the organic light-emitting material 175-1 is dropped in the row direction needs to satisfy a preset width. Furthermore, an area ratio between subpixels needs to be previously set by taking into consideration a light-emitting device characteristic and white balance.

In a high-resolution display device having a high pixel per inch (PPI), however, it is difficult to secure a sufficient dropping region because the size per pixel is significantly small. Particularly, in the case of a subpixel having a narrow area, the area of an opening allocated to the subpixel is narrow. In this case, it is difficult for the width of the opening in the row direction to satisfy a minimum width (hereinafter referred to as a "preset width") which may be configured by taking into consideration the amount of dropping of the organic light-emitting material 175-1 and a process margin.

Referring to FIG. 9(a), in the case of a first subpixel that belongs to subpixels according to a comparison example and that has a small area, it may be difficult for the width of a (2-1) opening OA2-1 in the row direction, allocated to the corresponding subpixel, to satisfy a preset width. In this case, a color mixture failure may occur between adjacent subpixels.

In contrast, referring to FIG. 9(b), according to an aspect of the present disclosure, a (2-1) opening OA2-1 allocated to a first subpixel having a narrow area may include a part having a wide width in accordance with the area of the convex part 161 of a (1-1) electrode 160-1. Accordingly, the (2-1) opening OA2-1 can satisfy a preset width in the region in which the convex part 161 has been formed. In this case, in order to satisfy a preset area ratio, a total width of the (2-1) opening OA2-1 allocated to the first subpixel is reduced to the extent corresponding to the area of the convex part 161.

A (2-3) opening OA2-3 allocated to a third subpixel having a relatively wide area may include a part having a narrow width in accordance with the area of the concave part 163 of a (1-3) electrode 160-3. In order to satisfy a preset area ratio, however, a total width of the (2-3) opening OA2-3 allocated to the third subpixel is increased to the extent corresponding to the area of the concave part 163. Accordingly, the (2-3) opening OA2-3 can satisfy a preset width in the region in which the concave part 163 has been formed and/or other regions.

As described above, an aspect of the present disclosure can sufficiently secure the area of a dropping region to which the organic light-emitting material 175-1 is dropped while maintaining a preset area ratio between subpixels. Accordingly, an aspect of the present disclosure has advantages in that it can prevent a color mixture failure while maintaining a light-emitting device characteristic and white balance.

FIGS. 10A to 13B are diagrams for illustrating a process of forming first electrodes, a bank, and an organic emission layer in a time series. FIGS. 10A, 11B, 12A, and 13A are plan views, and FIGS. 10B, 11B, 12B, and 13B are cross-sectional views taken along lines V-V', VI-VI' and VII-VII' of FIGS. 10A, 11B, 12A, and 13A, respectively.

Figure 10A:
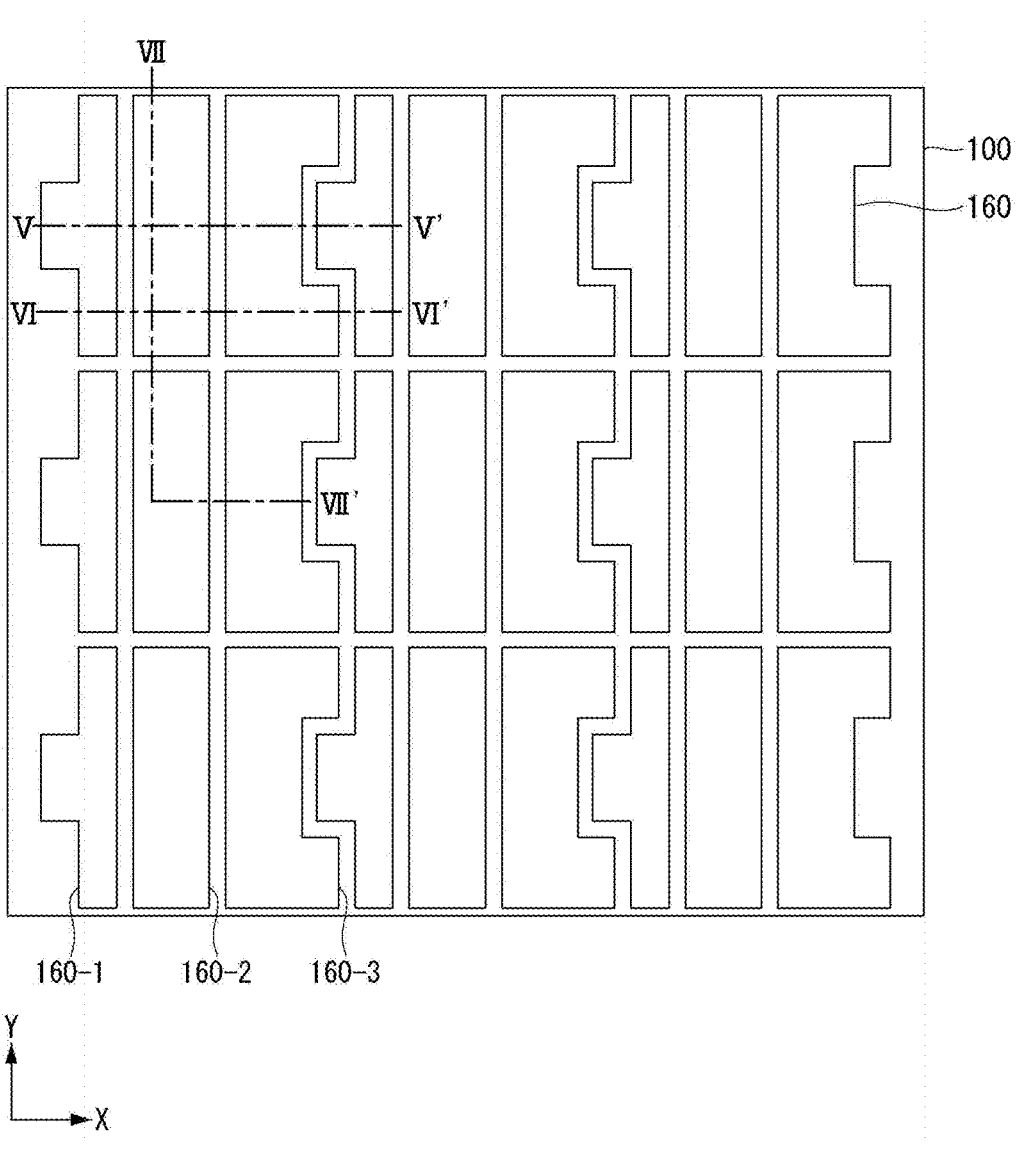
FIGS. 10A to 10B, 11A to 11B, 12A to 12B and 13A to 13B are diagrams for illustrating a process of forming first electrodes, a bank, and an organic emission layer in a time series.
Figure 10B:
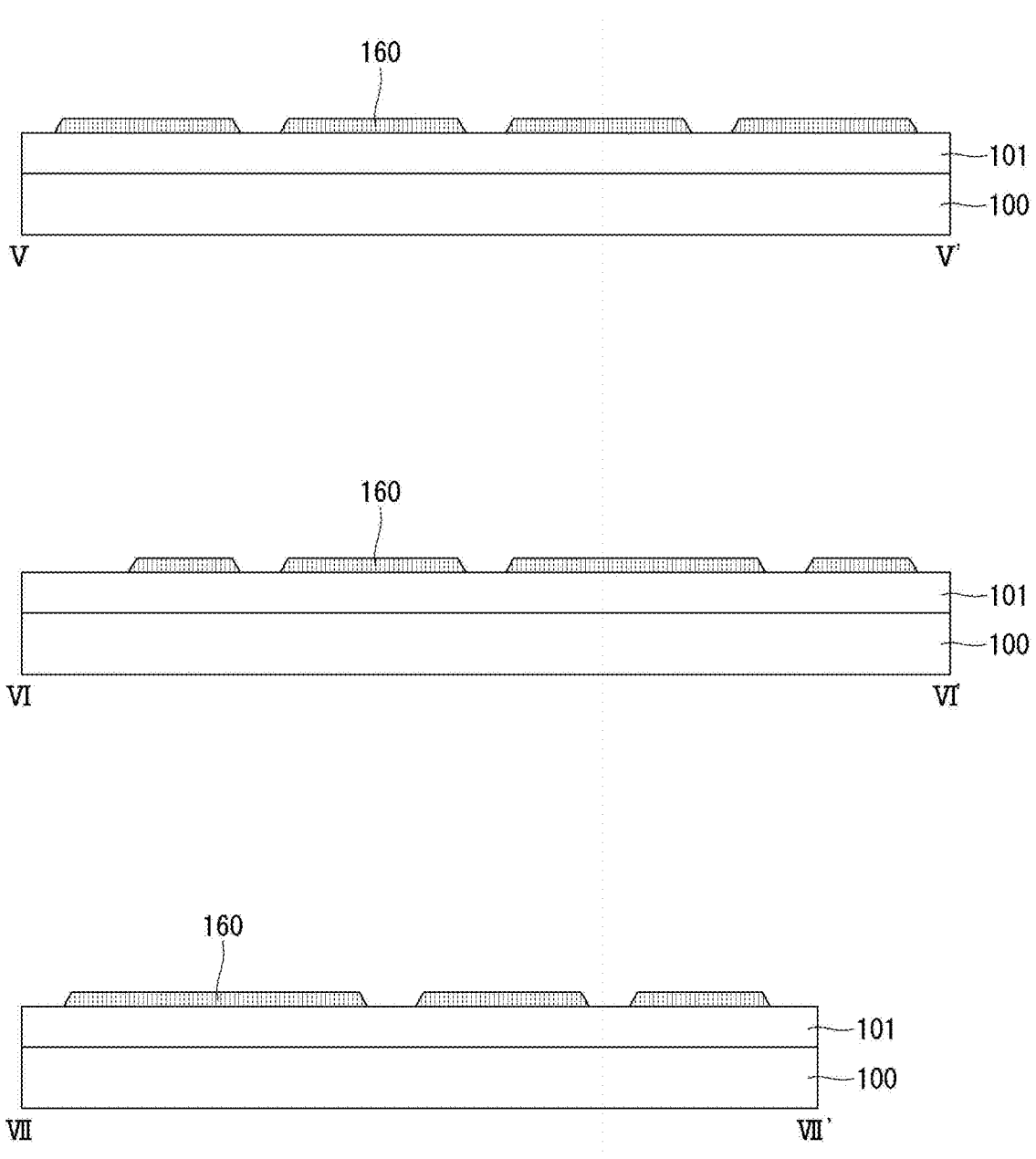

Referring to FIGS. 10A and 10B, the first electrode 160 is formed on the substrate 100. One first electrode 160 may be allocated to one subpixel. The (1-1) electrodes 160-1 may be positioned in the (3n−2) column, the (1-2) electrodes 160-2 may be positioned in the (3n−1) column, and the (1-3) electrodes 160-3 may be positioned in the 3n column. The first electrodes 160 include the (1-1) electrode 160-1, the (1-2) electrode 160-2, and the (1-3) electrode 160-3. The (1-1) electrode 160-1, the (1-2) electrode 160-2, and the (1-3) electrode 160-3 have different plane shapes.

Figure 11A:
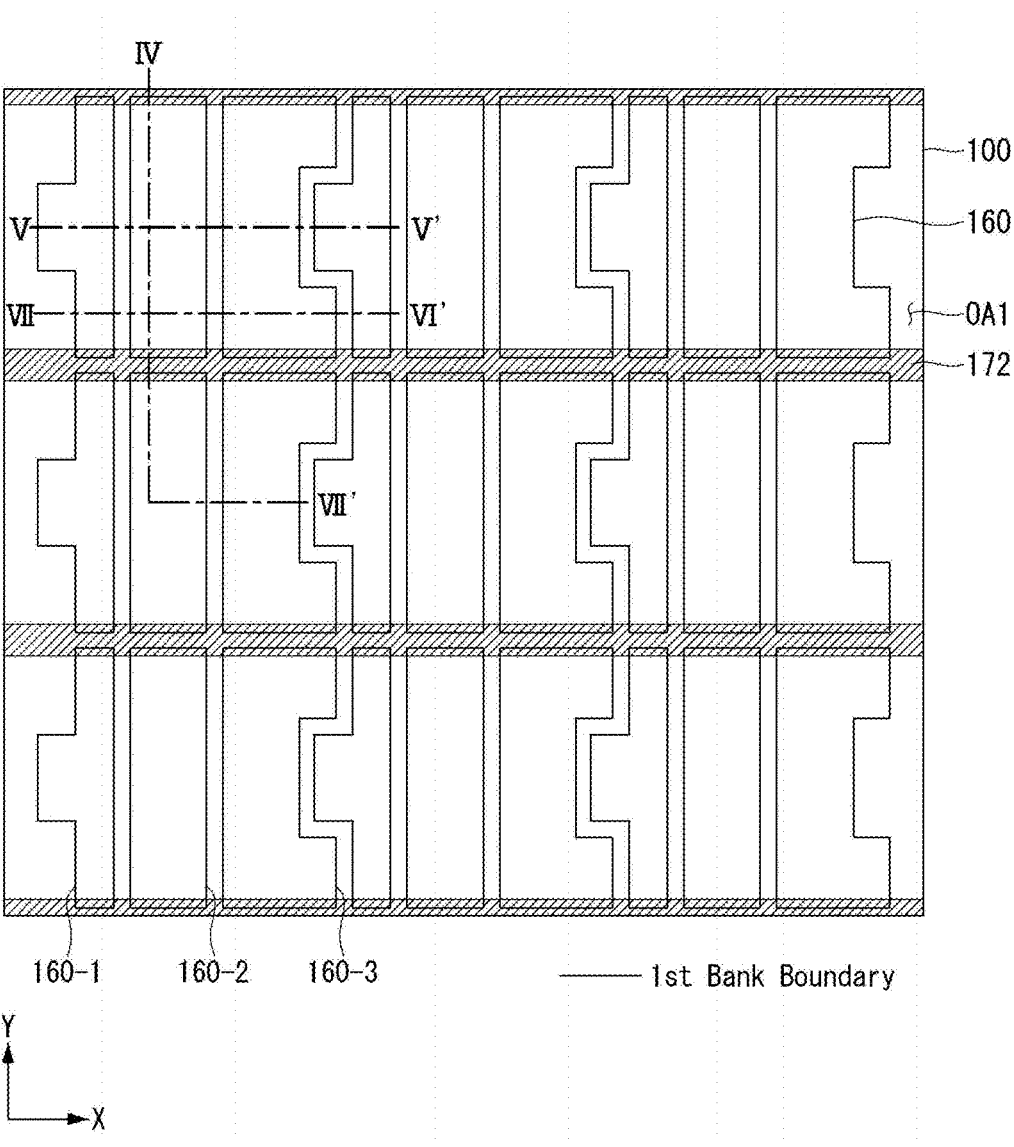
Figure 11B:
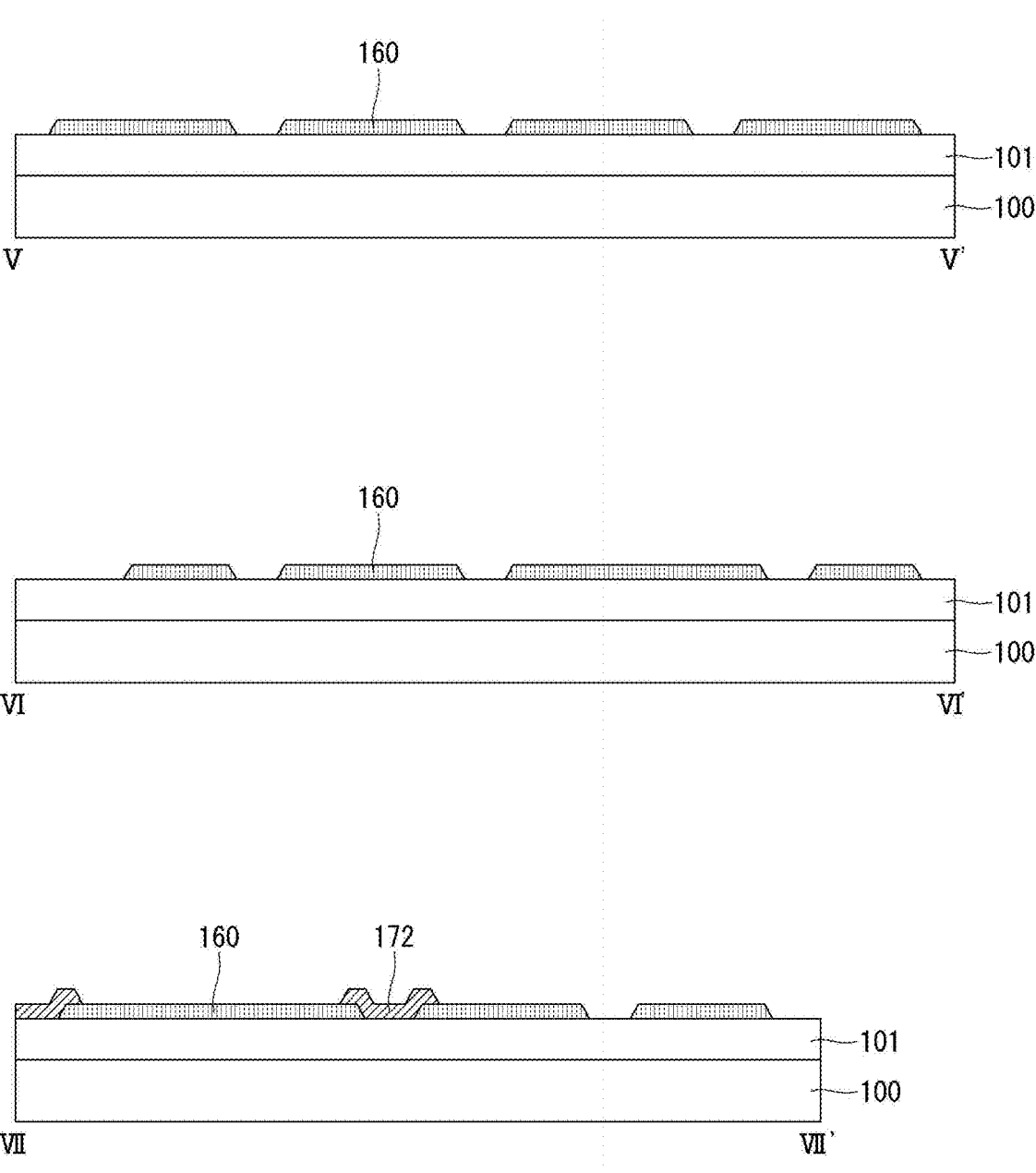

Referring to FIGS. 11A and 11B, the first bank 172 is formed on the substrate 100 in which the first electrode 160 has been formed. The first bank 172 include the first opening OA1. The first opening OA1 exposes a plurality of first electrodes 160 corresponding to one pixel. For example, one first opening OA1 may expose the (1-1) electrodes 160-1, the (1-2) electrodes 160-2, the (1-3) electrodes 160-3, arranged in one row, together.

Figure 12A:
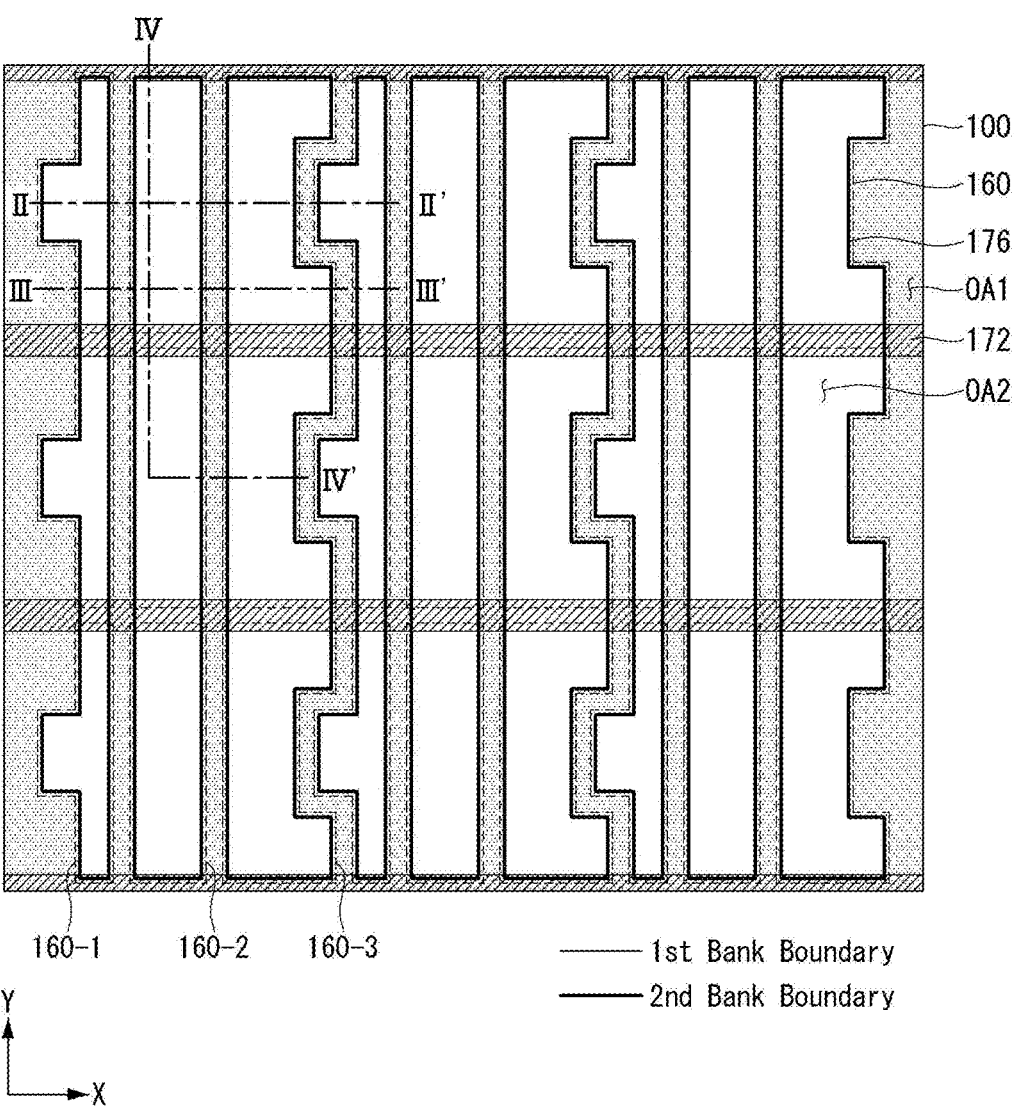
Figure 12B:
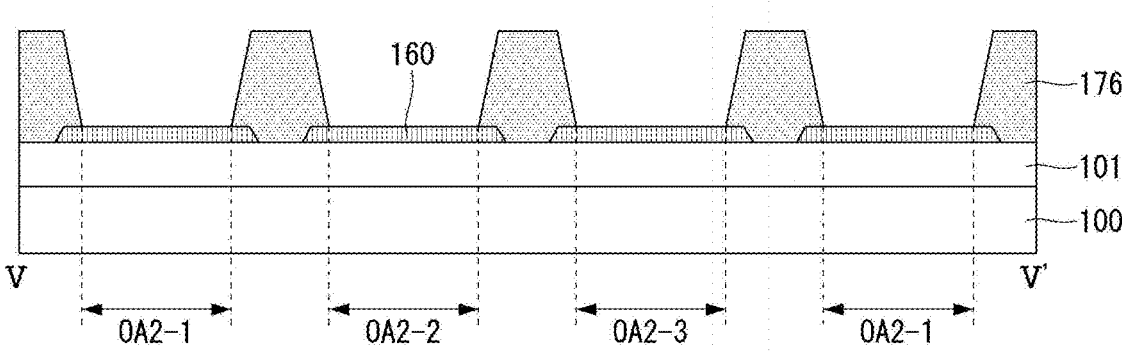
Figure 12B:
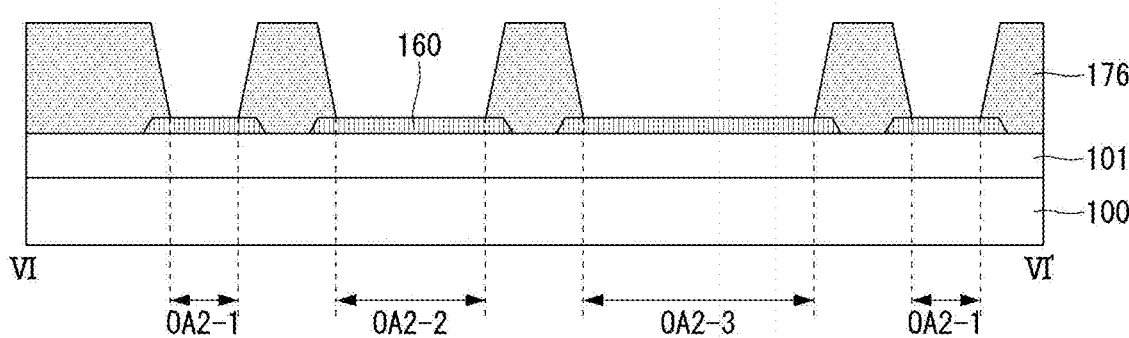
Figure 12B:
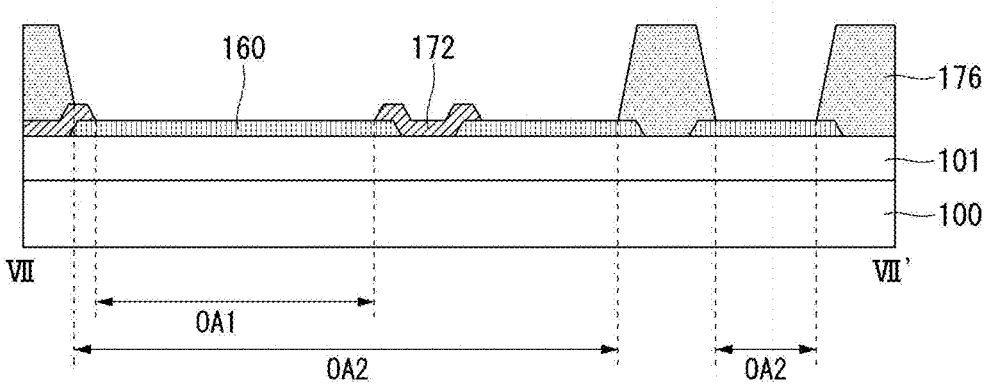

Referring to FIGS. 12A and 12B, the second bank 176 is formed on the substrate 100 in which the first bank 172 has been formed. The second bank 176 includes the second opening OA2. The second opening OA2 exposes a plurality of first electrodes 160 arranged in the column direction, together.

For example, (1-1) electrodes 160-1 arranged in the (3n−2) column may be exposed at the same time through one second opening OA2. (1-2) electrodes 160-2 arranged in the (3n−2) column may be exposed at the same time through one second opening OA2. (1-3) electrodes 160-3 arranged in the (3n−2) column may be exposed at the same time through one second opening OA2. An emission region may be defined by a combination structure of the first bank and the second bank 176.

Figure 13A:
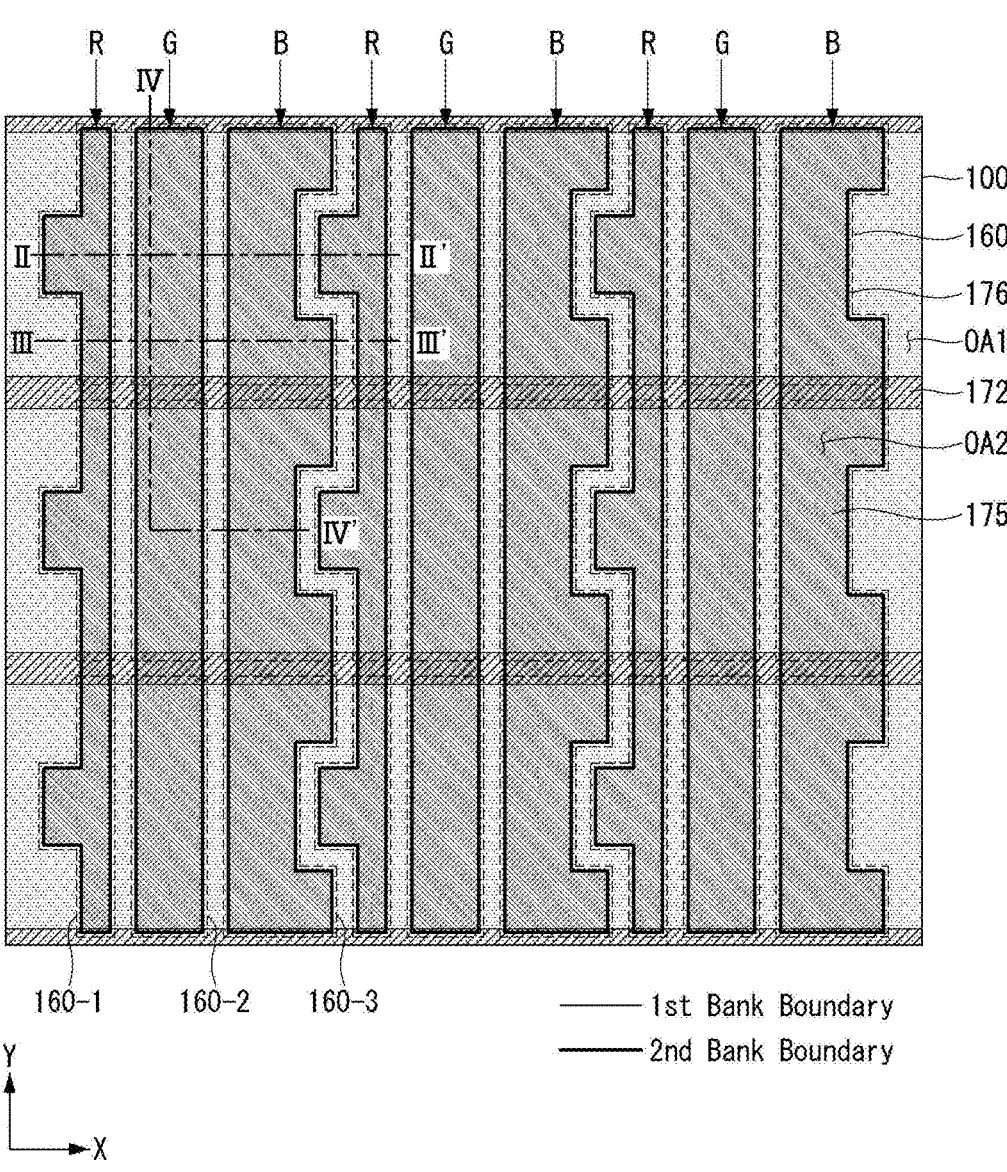
Figure 13B:
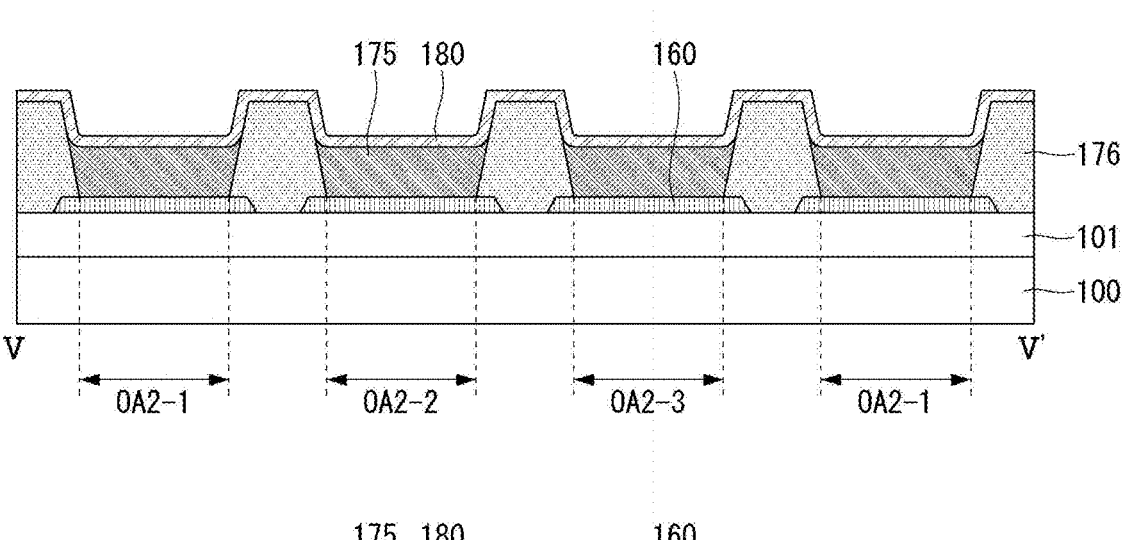
Figure 13B:
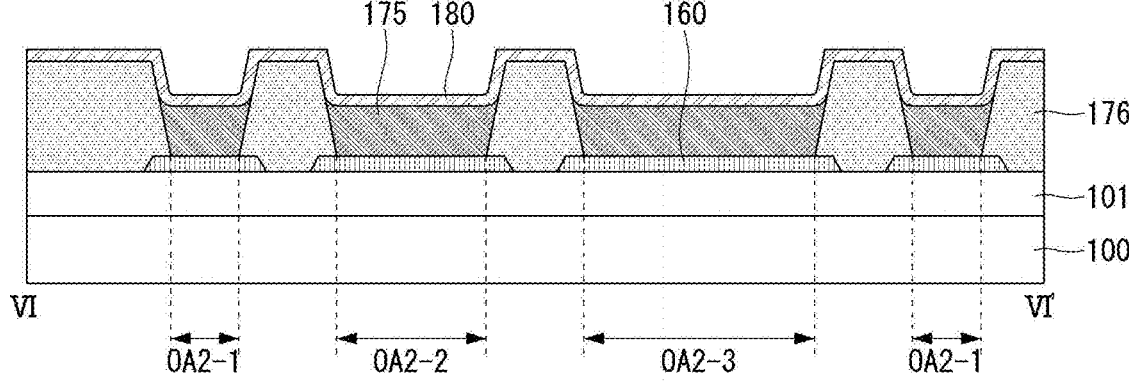
Figure 13B:
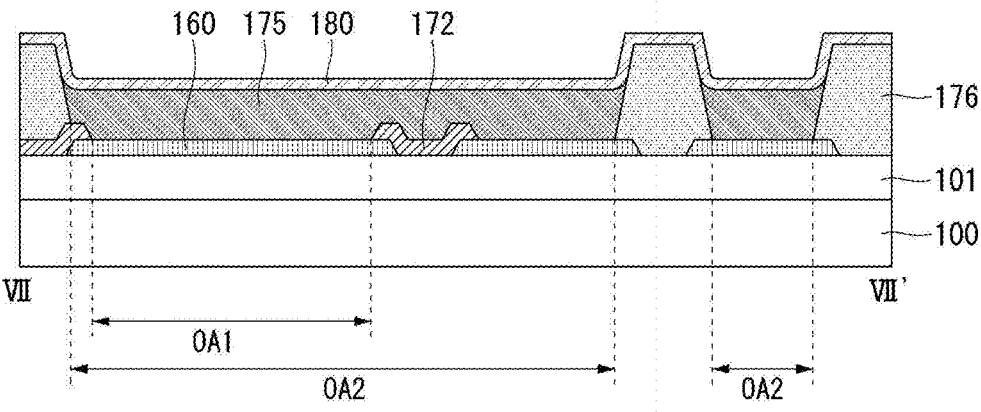

Referring to FIGS. 13A and 13B, the organic emission layer 175 and the second electrode 180 are sequentially formed on the substrate 100 in which the second bank 176 has been formed. The organic emission layer 175 may include the first organic emission layer 175-1 emitting light of the first color, the second organic emission layer 175-2 emitting light of the second color, and the third organic emission layer 175-3 emitting light of the third color.

For example, the first organic emission layer 175-1 may be formed on the second opening OA2 exposing the (1-1) electrodes 160-1 arranged in the (3n−2) column. The second organic emission layer 175-2 may be formed on the second opening OA2 exposing the (1-2) electrodes 160-2 arranged in the (3n−1) column. The third organic emission layer 175-3 may be formed on the second opening OA2 exposing the (1-3) electrodes 160-3 arranged in the (3n−2) column.

Figure 14:
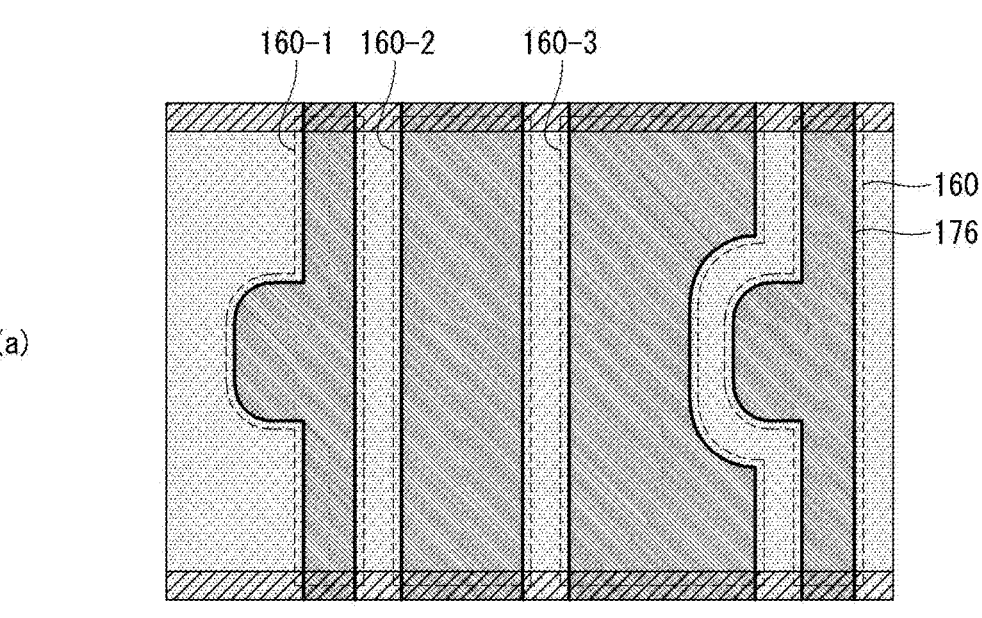
FIG. 14 is a schematic diagram for illustrating another example of the shape of a first electrode and a second bank.
Figure 14:
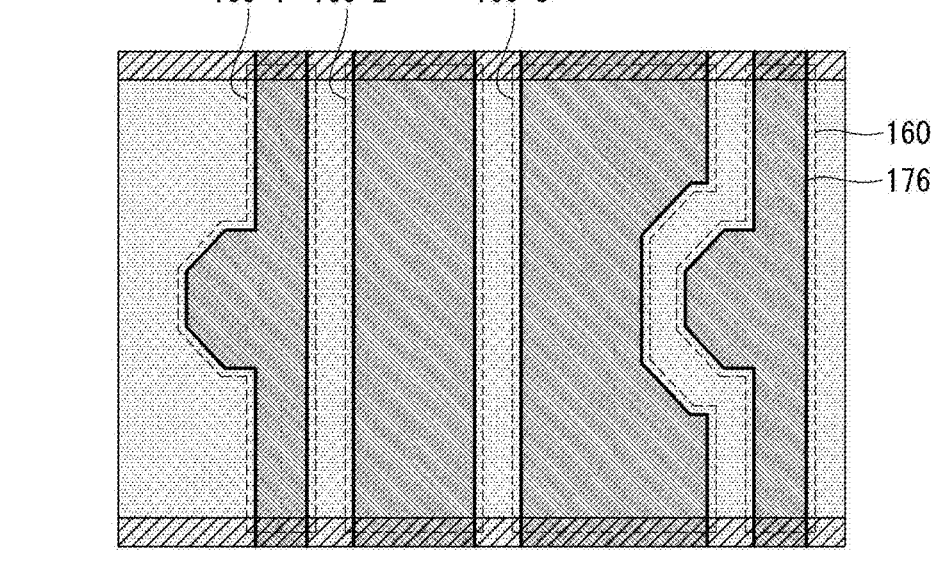

FIG. 14 is a diagram for illustrating another example of the shape of a first electrode and a second bank.

Referring to FIG. 14A, the convex part 161 of the (1-1) electrode 160-1 may have a shape having a rounded corner. The concave part 163 of the (1-3) electrode 160-3 may have a shape having a rounded corner in accordance with the rounded corner of the convex part 161. The second bank 176 positioned between the (1-1) electrode 160-1 and the (1-3) electrode 160-3 adjacent each other may be extended in the column direction a round form along the shapes of the convex part 161 and the concave part 163, in the region in which the convex part 161 and the concave part 163 are disposed.

As described above, the top of the second bank 176 may have a hydrophobic property, and the lateral part thereof may have a hydrophilic property. In this case, if the second bank 176 has a round shape, a contact area between the lateral part of the second bank 176 and an organic light-emitting material increases. Accordingly, a dropped organic light-emitting material can be effectively spread because it comes into contact with the lateral part of the second bank 176 having a hydrophilic property. Accordingly, the thickness uniformity of the organic emission layer formed after curing may be improved significantly.

Referring to FIG. 14B, the convex part 161 of the (1-1) electrode 160-1 may have a polygon shape, such as a triangle or a quadrangle. Accordingly, the concave part 163 of the (1-3) electrode 160-3 may also have a polygon shape, such as a triangle or a quadrangle, in accordance with the polygon shape of the convex part 161. The second bank 176 positioned between the (1-1) electrode 160-1 and the (1-3) electrode 160-3 adjacent each other may be extended in the column direction along the shape of the convex part 161 and the concave part 163, in the region in which the convex part 161 and the concave part 163 are disposed. As described above, an aspect of the present disclosure has an advantage in that it can have a degree of freedom of design because the shape of the convex part 161 and the concave part 163 are freely changed. For example, the shape of the convex part 161 and the concave part 163 may be selected by taking into consideration the viscosity of an organic light-emitting material and content of solids.

Figure 15:
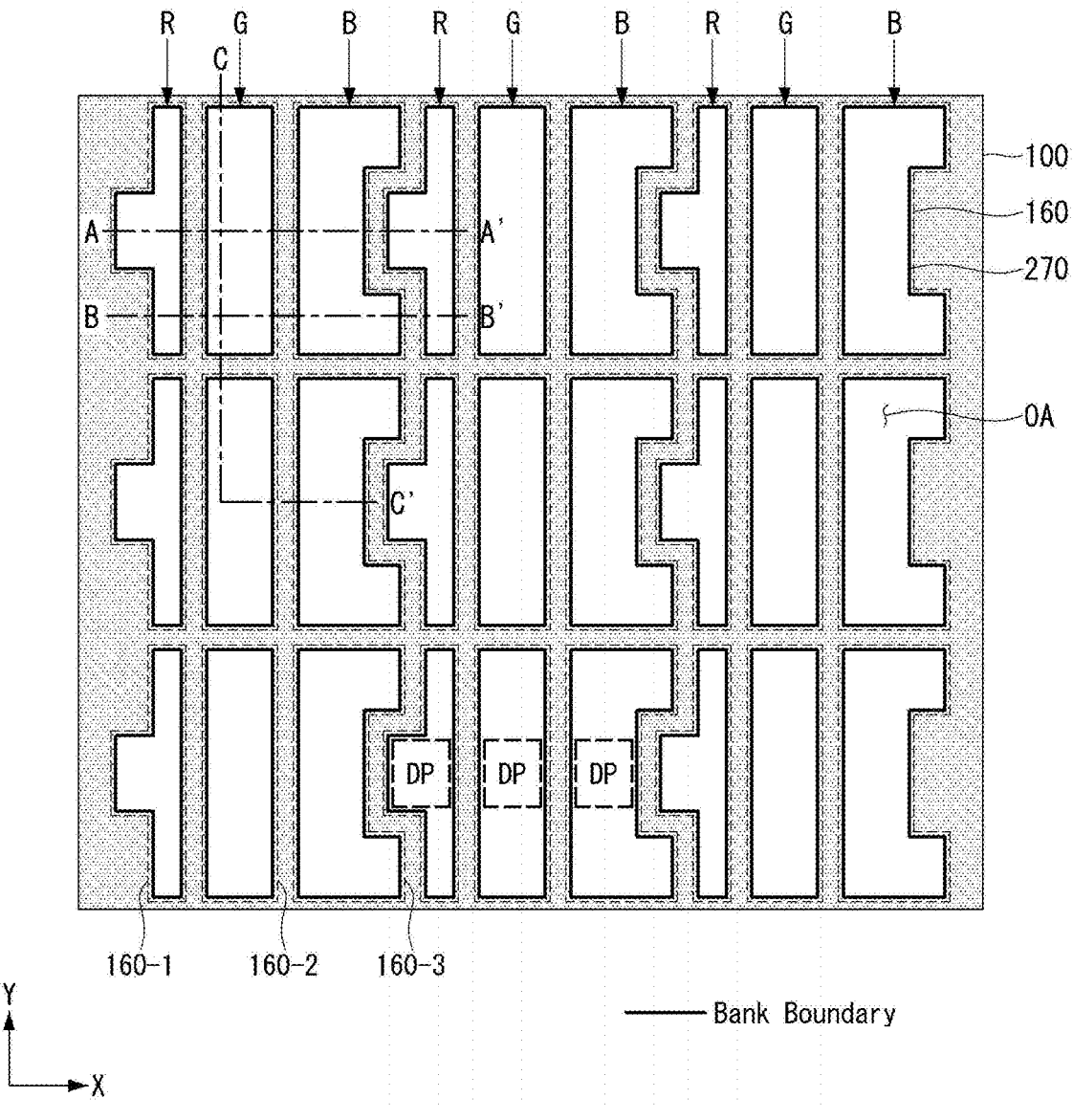
FIG. 15 is a plan view schematically showing a display device according to an aspect of the present disclosure.
Figure 16:
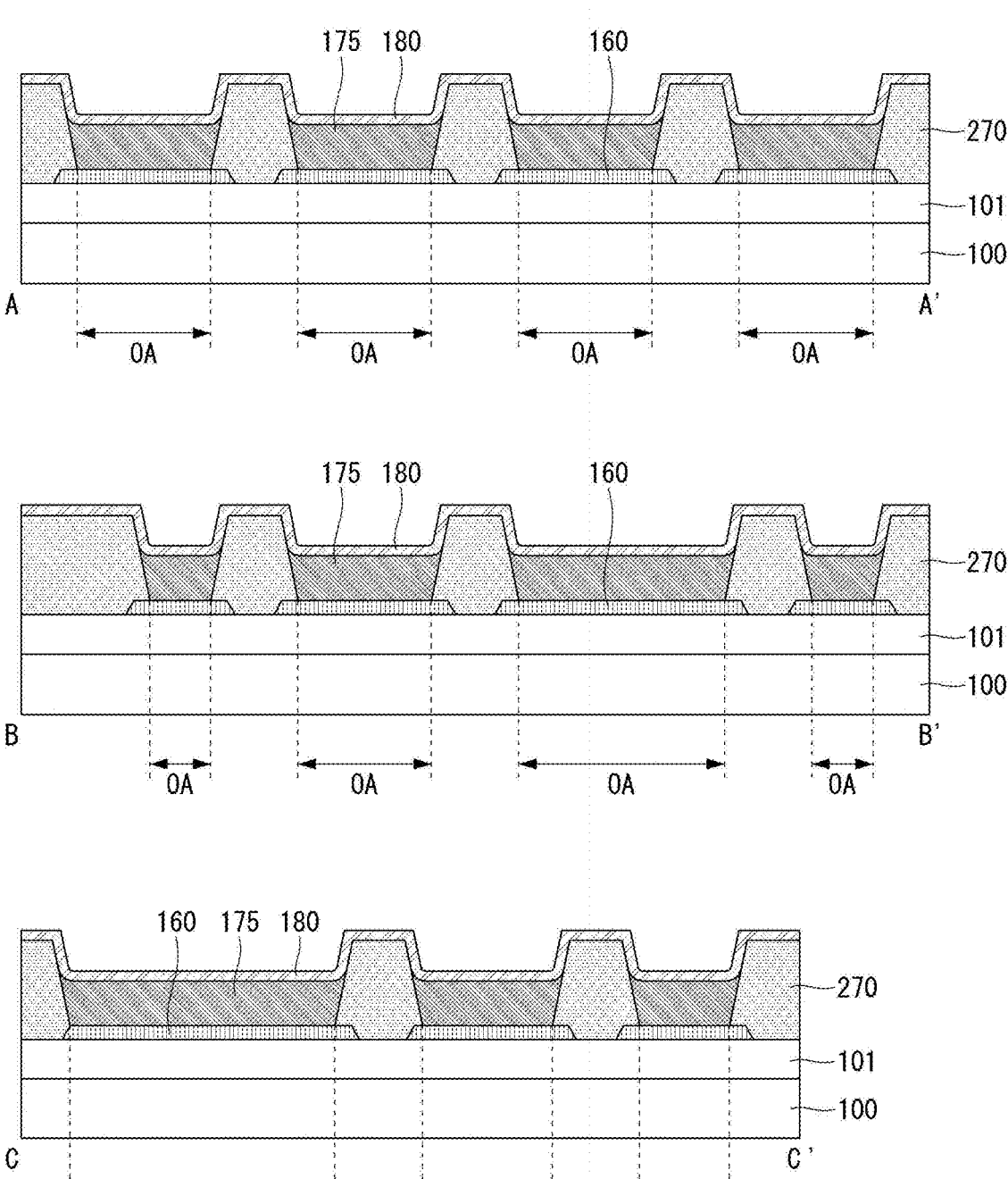
FIG. 16 shows cross-sectional views taken along lines VIII-VIII', IX-IX' and X-X' of FIG. 15.

FIG. 15 is a plan view schematically showing a display device according to an aspect of the present disclosure. FIG. 16 shows cross-sectional views taken along lines VIII-VIII', IX-IX', and X-X' of FIG. 15.

Referring to FIGS. 15 and 16, the display device according to the aspect of the present disclosure includes a substrate 100 in which subpixels SP have been arranged. A circuit element layer 101 and an OLED 60 driven by the elements of the circuit element layer 101 are disposed on the substrate 100.

A signal line for applying a driving signal to the OLED 60 and electrodes may be arranged in the circuit element layer 101. The signal line and the electrodes may be disposed with at least one insulating layer interposed therebetween, if necessary. If the organic light-emitting display is implemented using an active matrix (AM) method, the circuit element layer 101 may further include a transistor allocated to each subpixel SP. In this case, the subpixel SP may have a structure, such as that shown in FIG. 5, but is not limited thereto.

The OLED 60 includes a first electrode 160, a second electrode 180, and an organic emission layer 175 interposed between the first electrode 160 and the second electrode 180. The first electrode 160 may be an anode, and the second electrode 180 may be a cathode.

More specifically, the subpixels SP may be arranged in a row direction (e.g., X-axis direction) and a column direction (e.g., Y-axis direction) which cross each other. Subpixels SP adjacently arranged in the row direction may emit light of different colors, and subpixels SP adjacently arranged in the column direction may emit light of the same color.

The subpixels include a first subpixel in a (3n–2) (n is a natural number of 1 or more) column, a second subpixel arranged in a (3n–1) column, and a third subpixel arranged in a 3n column. That is, the first subpixel, second subpixel and third subpixel are sequentially arranged alternately in the row direction. The first subpixel may emit light of a first color. The second subpixel may emit light of a second color. The third subpixel may emit light of a third color. The first color may be red, the second color may be green, and the third color may be blue, but are not limited thereto.

The first electrode 160 of the OLED 60 is positioned in the subpixel SP. One first electrode 160 may be allocated to one subpixel SP. Adjacent first electrodes 160 are spaced apart at predetermined intervals.

The first electrodes 160 include a (1-1) electrode 160-1, a (1-2) electrode 160-2, and a (1-3) electrode 160-3. The (1-1) electrode 160-1, (1-2) electrode 160-2, and (1-3) electrode 160-3 have different plane shapes. The (1-1) electrode 160-1 may be allocated to the first subpixel, the (1-2) electrode 160-2 may be allocated to the second subpixel, and the (1-3) electrode 160-3 may be allocated to the third subpixel.

The (1-1) electrodes 160-1 are disposed in the (3n–2) column. The (1-1) electrodes 160-1 are sequentially disposed in the column direction. The (1-2) electrodes 160-2 are disposed in the (3n–1) column. The (1-2) electrodes 160-2 are sequentially disposed in the column direction. The (1-3) electrodes 160-3 are disposed in the 3n column. The (1-3) electrodes 160-3 are sequentially disposed in the column direction. Accordingly, the (1-1) electrode 160-1, (1-2) electrode 160-2, and (1-3) electrode 160-3 are sequentially disposed alternately in the row direction.

The (1-1) electrode 160-1 has a convex part 161 on its one side. The convex part 161 may be disposed on one side of the (1-1) electrode 160-1 not adjacent to the (1-2) electrode 160-2. The convex part 161 may be positioned on one side of the (1-1) electrode 160-1 adjacent to the (1-3) electrode 160-3. The area of the region in which the convex part 161 of the (1-1) electrode 160-1 has been formed has a wide area compared to other regions. The convex part 161 may be protruded toward the (1-3) electrode 160-3 in a region adjacent to the (1-3) electrode 160-3.

The (1-2) electrode 160-2 may have a square or an oblong.

The (1-3) electrode 160-3 has a concave part 163 on its one side. The concave part 163 may be positioned on one side of the (1-3) electrode 160-3 not adjacent to the (1-2) electrode 160-2. The concave part 163 may be positioned on one side of the (1-1) electrode 160-1 adjacent to the (1-1) electrode 160-1. In the region in which the (1-1) electrode 160-1 and the (1-3) electrode 160-3 are adjacently disposed, the convex part 161 of the (1-1) electrode 160-1 is opposite the concave part 163 of the (1-3) electrode 160-3. In the region in which the (1-1) electrode 160-1 and the (1-3) electrode 160-3 are adjacently disposed, the convex part 161 of the (1-1) electrode 160-1 may be inserted in the concave part 163 of the (1-3) electrode 160-3.

A bank 270 is positioned on the substrate 100 in which the first electrode 160 has been formed. The bank 270 may partition subpixels adjacent in the column direction and the row direction.

The bank 270 includes an opening OA exposing at least one part of the first electrode 160. One opening OA may be allocated to one first electrode 160. A part of the first electrode 160 exposed by the opening OA may be defined as an emission region. The plane shape of the emission region may correspond to that of the first electrode 160.

An opening OA exposing each of the (1-1) electrodes 160-1 arranged in the (3n–2) column, an opening OA exposing each of the (1-2) electrodes 160-2 arranged in the (3n–1) column, and an opening OA exposing each of the (1-3) electrodes 160-3 arranged in the 3n column have different areas and shapes.

A part that belongs to the opening OA and that exposes the convex parts 161 of the (1-1) electrodes 160-1 may be configured to have a relatively wide width compared to a part exposing other parts of the (1-1) electrodes 160-1. Accordingly, a part of the opening OA exposing the convex part 161 can satisfy a minimum width which may be set by taking into consideration the amount of dropping of an organic light-emitting material and a process margin. In this case, the part of the opening OA exposing the convex part 161 may be assigned as a dropping region DP to which an organic light-emitting material is dropped upon performing a solution process.

In this case, an opening OA that belongs to the opening OA and that exposes the (1-3) electrode 160-3 may be configured to have a relatively narrow width in a region, corresponding to the concave part 163, compared to other regions. However, an opening OA exposing the (1-3) electrode 160-3 has been configured to have a large width compared to the opening OA exposing the (1-1) electrode 160-1. Accordingly, in other regions in addition to the region in which the concave part 163 has been formed, the opening OA exposing the (1-3) electrode 160-3 can satisfy a minimum width which may be set by taking into consideration the amount of dropping of an organic light-emitting material and a process margin. In this case, the opening OA exposing the (1-3) electrode 160-3 may be assigned as a region DP to which an organic light-emitting material is dropped upon performing a solution process.

As described above, the organic light-emitting display according to the first modification example of the present disclosure has an advantage in that it can significantly improve display quality degradation attributable to a color mixture failure because the dropping area of an organic light-emitting material can be sufficiently secured.

An organic emission layer 175 is positioned on the substrate 100 in which the bank 270 has been formed. The organic emission layer 175 may be formed within a corresponding opening OA. The organic emission layers 175 formed within openings OA adjacent in the column direction and the row direction may be physically separated by the bank 270.

Figure 17:
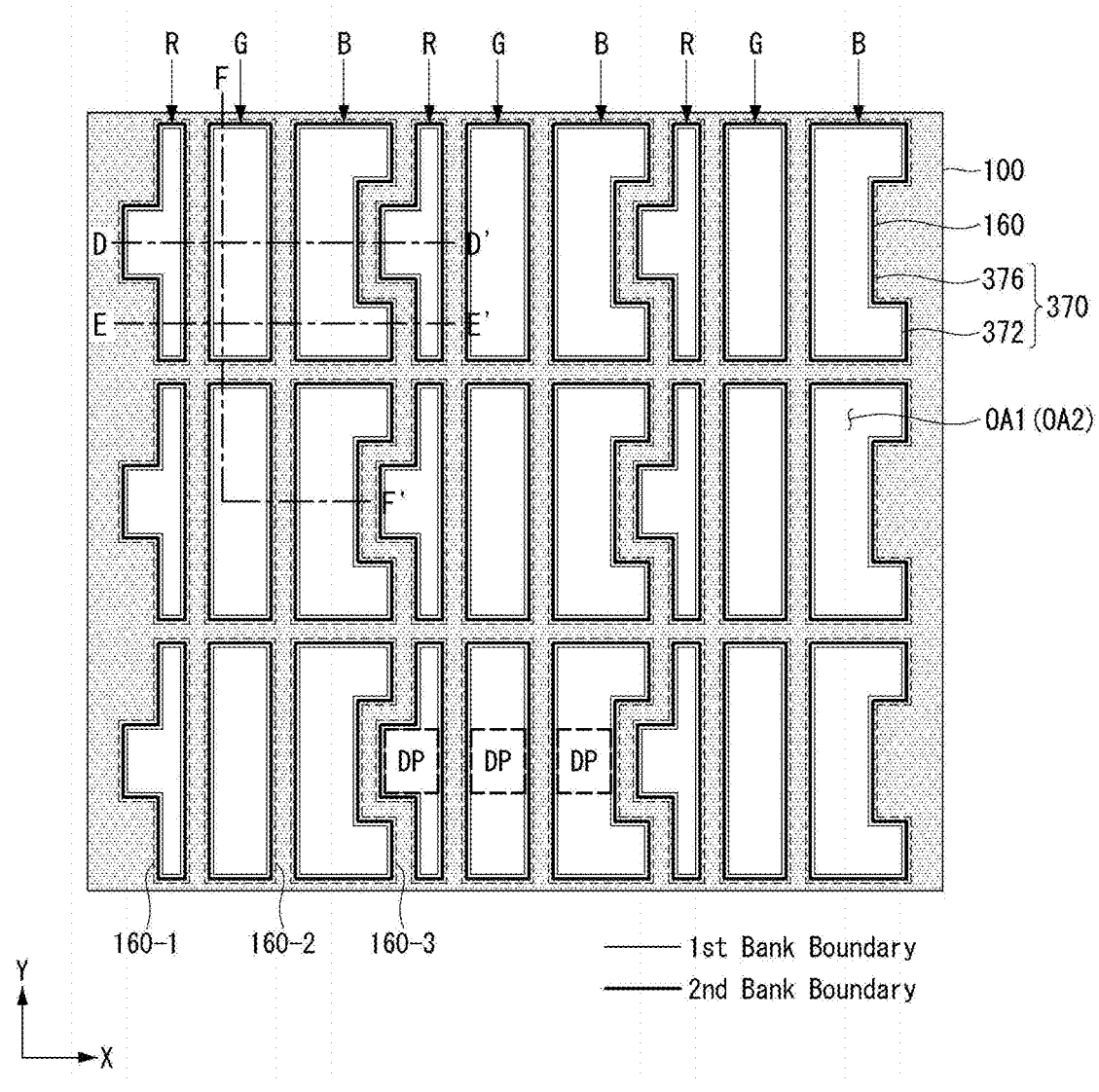
FIG. 17 is a plan view schematically showing a display device according to another aspect of the present disclosure.
Figure 18:
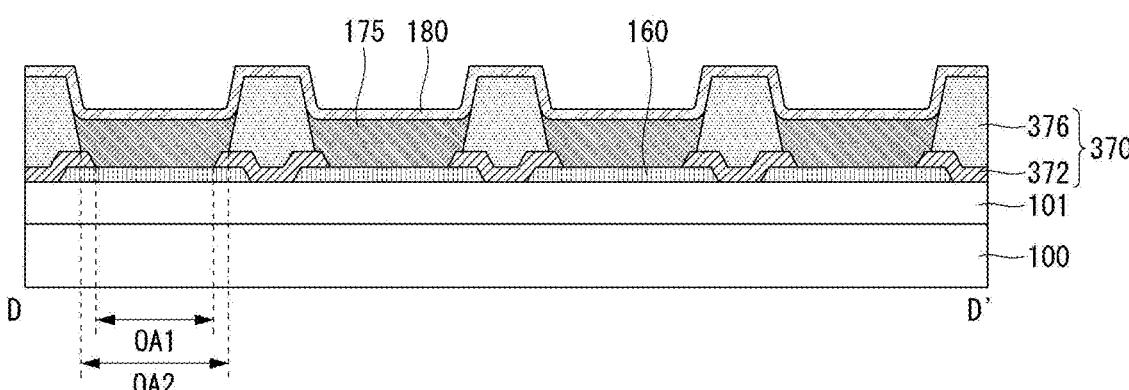
FIG. 18 shows cross-sectional views taken along lines A-A', B-B' and C-C' of FIG. 17.
Figure 18:
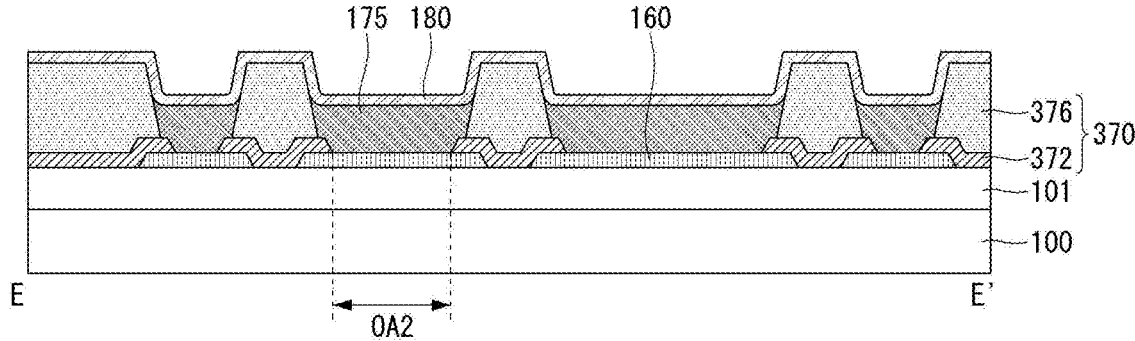
Figure 18:
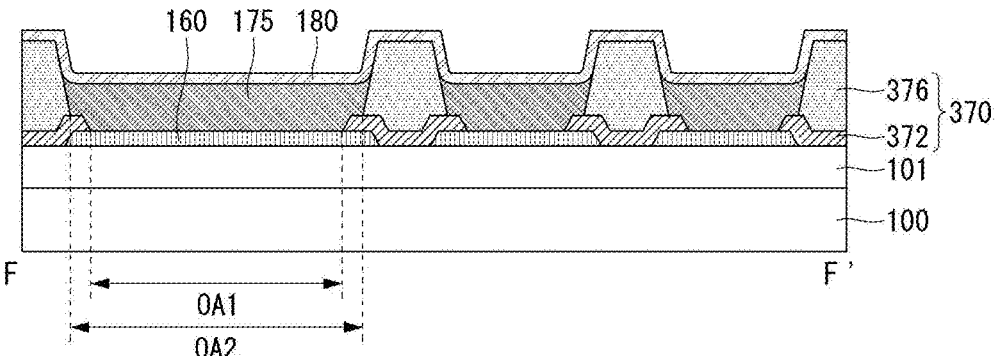

FIG. 17 is a plan view schematically showing a display device according to another aspect of the present disclosure. FIG. 18 shows cross-sectional views taken along lines A-A', B-B' and C-C' of FIG. 17.

Referring to FIGS. 17 and 18, the display device according to the second modification example of the present disclosure includes a substrate 100 in which subpixels SP have been arranged. A circuit element layer 101 and an OLED 60 driven by the elements of the circuit element layer 101 are disposed on the substrate 100.

A signal line for applying a driving signal to the OLED 60 and electrodes may be arranged in the circuit element layer 101. The signal line and the electrodes may be disposed with at least one insulating layer interposed therebetween, if necessary. If the organic light-emitting display is implemented using an active matrix (AM) method, the circuit element layer 101 may further include a transistor allocated to each subpixel SP. In this case, the subpixel SP may have a structure, such as that shown in FIG. 5, but is not limited thereto.

The OLED 60 includes a first electrode 160, a second electrode 180, and an organic emission layer 175 interposed between the first electrode 160 and the second electrode 180. The first electrode 160 may be an anode, and the second electrode 180 may be a cathode.

More specifically, the subpixels SP may be arranged in a row direction (e.g., X-axis direction) and a column direction (e.g., Y-axis direction) which cross each other. Subpixels SP adjacently arranged in the row direction may emit light of different colors, and subpixels SP adjacently arranged in the column direction may emit light of the same color.

The subpixels include a first subpixel in a (3n-2) (n is a natural number of 1 or more) column, a second subpixel arranged in a (3n-1) column, and a third subpixel arranged in a 3n column. That is, the first subpixel, second subpixel and third subpixel are sequentially arranged alternately in the row direction. The first subpixel may emit light of a first color. The second subpixel may emit light of a second color. The third subpixel may emit light of a third color. The first color may be red, the second color may be green, and the third color may be blue, but are not limited thereto.

The first electrode 160 of the OLED 60 is positioned in the subpixel SP. One first electrode 160 may be allocated to one subpixel SP. Adjacent first electrodes 160 are spaced apart at predetermined intervals.

The first electrodes 160 include a (1-1) electrode 160-1, a (1-2) electrode 160-2, and a (1-3) electrode 160-3. The (1-1) electrode 160-1, (1-2) electrode 160-2, and (1-3) electrode 160-3 have different plane shapes. The (1-1) electrode 160-1 may be allocated to the first subpixel, the (1-2) electrode 160-2 may be allocated to the second subpixel, and the (1-3) electrode 160-3 may be allocated to the third subpixel.

The (1-1) electrodes 160-1 are disposed in the (3n-2) column. The (1-1) electrodes 160-1 are sequentially disposed in the column direction. The (1-2) electrodes 160-2 are disposed in the (3n-1) column. The (1-2) electrodes 160-2 are sequentially disposed in the column direction. The (1-3) electrodes 160-3 are disposed in the 3n column. The (1-3) electrodes 160-3 are sequentially disposed in the column direction. Accordingly, the (1-1) electrode 160-1, (1-2) electrode 160-2, and (1-3) electrode 160-3 are sequentially disposed alternately in the row direction.

The (1-1) electrode 160-1 has a convex part 161 on its one side. The convex part 161 may be disposed on one side of the (1-1) electrode 160-1 not adjacent to the (1-2) electrode 160-2. The convex part 161 may be positioned on one side of the (1-1) electrode 160-1 adjacent to the (1-3) electrode 160-3. The area of the region in which the convex part 161 of the (1-1) electrode 160-1 has been formed has a wide area compared to other regions. The convex part 161 may be protruded toward the (1-3) electrode 160-3 in a region adjacent to the (1-3) electrode 160-3.

The (1-2) electrode 160-2 may have a square or an oblong.

The (1-3) electrode 160-3 has a concave part 163 on its one side. The concave part 163 may be positioned on one side of the (1-3) electrode 160-3 not adjacent to the (1-2) electrode 160-2. The concave part 163 may be positioned on one side of the (1-1) electrode 160-1 adjacent to the (1-1) electrode 160-1. In the region in which the (1-1) electrode 160-1 and the (1-3) electrode 160-3 are adjacently disposed, the convex part 161 of the (1-1) electrode 160-1 is opposite the concave part 163 of the (1-3) electrode 160-3. In the region in which the (1-1) electrode 160-1 and the (1-3) electrode 160-3 are adjacently disposed, the convex part 161 of the (1-1) electrode 160-1 may be inserted in the concave part 163 of the (1-3) electrode 160-3.

A bank 370 is positioned on the substrate 100 in which the first electrode 160 has been formed. The bank 370 includes a first bank 372 and a second bank 376.

The first bank 372 includes a first opening OA1 exposing at least one part of the first electrode 160. One first opening OA1 may be allocated to one first electrode 160. The first bank 372 may be formed to cover the edge of the first electrode 160, thus exposing most of the central part of the first electrode 160. In this case, the boundary of the first opening OA1 may be positioned inside the boundary of the first electrode 160. The boundary of the first opening OA1 determines the plane shape of the first opening OA1. The boundary of the first electrode 160 determines the plane shape of the first electrode 160. A part of the first electrode 160 exposed by the first opening OA1 may be defined as an emission region.

A first opening OA1 exposing the (1-1) electrodes 160-1 arranged in the (3n−2) column, a first opening OA1 exposing the (1-2) electrodes 160-2 arranged in the (3n−1) column, and a first opening OA1 exposing the (1-3) electrodes 160-3 arranged in the 3n column have different areas and shapes.

The second bank 376 includes a second opening OA2 exposing at least one part of the first electrode 160. One second opening OA2 may be allocated to one first electrode 160.

The second opening OA2 may be formed to have a wider area than the first opening OA1, thus accommodating the first opening OA1. That is, the boundary of the second opening OA2 may be spaced apart toward the outside of the boundary of the first opening OA1 at a preset interval. The boundary of the second opening 61 determines the plane shape of the second opening 61.

A second opening OA2 exposing each of the (1-1) electrodes 160-1 arranged in the (3n−2) column, a second opening OA2 exposing each of the (1-2) electrodes 160-2 arranged in the (3n−1) column, and a second opening OA2 exposing each of the (1-3) electrodes 160-3 arranged in the 3n column have different areas and shapes.

The plane shapes of the first electrode 160, first opening OA1, and second opening OA2 allocated to one subpixel may correspond to each other.

A part that belongs to the second opening OA and that exposes the convex parts 161 of the (1-1) electrodes 160-1 may be configured to have a relatively wide width compared to a part exposing other parts of the (1-1) electrodes 160-1. Accordingly, a part that belongs to the second opening OA2 and that exposes the convex part 161 can satisfy a minimum width which may be set by taking into consideration the amount of dropping of an organic light-emitting material and a process margin. In this case, the part of the second opening OA2 exposing the convex part 161 may be assigned as a dropping region DP to which an organic light-emitting material is dropped upon performing a solution process.

In this case, a second opening OA2 that belongs to the second opening OA and that exposes the (1-3) electrode 160-3 may be configured to have a relatively narrow width in a region, corresponding to the concave part 163, compared to other parts. However, the second opening OA2 exposing the (1-3) electrode 160-3 has been configured to have a large width compared to the second opening OA2 exposing the (1-1) electrode 160-1. Accordingly, in other regions in addition to the region in which the concave part 163 has been formed, the second opening OA2 exposing the (1-3) electrode 160-3 can satisfy a minimum width which may be set by taking into consideration the amount of dropping of an organic light-emitting material and a process margin. In this case, the second opening OA2 exposing the (1-3) electrode 160-3 may be assigned as a region DP to which an organic light-emitting material is dropped upon performing a solution process.

As described above, the organic light-emitting display according to the second modification example of the present disclosure has an advantage in that it can significantly improve display quality degradation attributable to a color mixture failure because the dropping area of an organic light-emitting material can be sufficiently secured.

An organic emission layer 175 is positioned on the substrate 100 in which the bank 370 has been formed. The organic emission layer 175 may be formed within a corresponding opening OA. The organic emission layers 175 formed within openings OA adjacent in the column direction and the row direction may be physically separated by the bank 370.

The first bank 372 is a thin film of a hydrophilic component provided to prevent a wettability failure attributable to the hydrophobic property of the first electrode 160, and functions to well spread an organic light-emitting material having a hydrophilic property. The second bank 376 is a thick of a hydrophobic component, and functions to push an organic light-emitting material of a hydrophilic property toward a central part. The organic emission layer 175 may be formed to have a uniform thickness on the emission region through a combination structure of the first bank 172 and the second bank 176.

Those skilled in the art may change and modify the present disclosure in various ways without departing from the technical spirit of the present disclosure through the above description. Accordingly, the technical range of the present disclosure should not be limited to the detailed contents of the specification, but should be determined by the claims.

An organic light-emitting display comprises a substrate having a plurality of subpixels arranged in a row direction and a column direction crossing the row direction; first electrodes allocated to the subpixels, respectively, and comprising (1-1) electrodes arranged in a (3n−2) (n is a natural number of 1 or more) column, (1-2) electrodes arranged in a (3n−1) column, and a (1-3) electrode arranged in a 3n column; and a bank having an opening exposing the first electrodes, wherein the (1-1) electrode comprises a convex part protruded toward the (1-3) electrode, and wherein the (1-3) electrode comprises a concave part opposing the convex part.

The convex part of the (1-1) electrode is inserted in the concave part of the (1-3) electrode.

The subpixels comprise a first subpixel having the (1-1) electrode, a second subpixel having the (1-2) electrode, and a third subpixel having the (1-3) electrode, and areas and shapes of the openings allocated to the first subpixel, the second subpixel, and the third subpixels, respectively, are different.

The bank comprises: a first bank having first openings, the first opening exposing one first electrode; and a second bank positioned above the first bank and having second openings, the second opening exposing a plurality of the first electrodes.

Plane shapes of the first electrode and the second opening allocated to one subpixel correspond to each other.

The subpixels comprise a first subpixel having the (1-1) electrode, a second subpixel having the (1-2) electrode, and a third subpixel having the (1-3) electrode, and areas and shapes of the second openings allocated to the first subpixel, the second subpixel, and the third subpixel, respectively, are different.

The bank comprises: a first bank positioned between the first electrodes adjacent in the column direction; and a second bank positioned between the first electrodes adjacent in the row direction.

At least one part of the first electrode exposed by a combination structure of the first bank and the second bank is defined as an emission region, and a plane shape of the emission region corresponds to a plane shape of the first electrode.

The subpixels comprise a first subpixel having the (1-1) electrode, a second subpixel having the (1-2) electrode, and a third subpixel having the (1-3) electrode, and areas and shapes of the emission regions allocated to the first subpixel, the second subpixel, and the third subpixel, respectively, are different.

The second bank is extended in the column direction in a straight-line form between the (1-1) electrodes arranged in the (3n−2) column and the (1-2) electrodes arranged in the (3n−1) column, the second bank is extended in the column direction in a straight-line form between the (1-2) electrodes arranged in the (3n−1) column and the (1-3) electrodes arranged in the 3n column, and the second bank is extended in the column direction in a zigzag form between the (1-3) electrodes arranged in the 3n column and the (1-2) electrodes arranged in the (3n−2) column.

The second bank comprises: (2-1) openings exposing the (1-1) electrodes, arranged in the (3n−2) column, together; (2-2) openings exposing the (1-2) electrodes, arranged in the (3n−1) column, together; and (2-3) openings exposing the (1-3) electrodes, arranged in the 3n column, together, and wherein areas and shapes of the (2-1) opening, the (2-2) opening, and the (2-3) opening are different.

The convex part has a shape having a rounded corner, and the concave part has a shape having a rounded corner in accordance with the shape of the convex part.

The first bank has a hydrophilic property, and the second bank has a hydrophobic property.

What is claimed is:

1. An organic light-emitting display, comprising:

a substrate having a plurality of subpixels arranged in a row direction and a column direction crossing the row direction;

a plurality of first electrodes respectively allocated to the plurality of subpixels and comprising a first sub-electrode arranged in a (3n−2) column, a second sub-electrode arranged in a (3n−1) column, and a third sub-electrode arranged in a 3n column (where n is a natural number of 1 or more);

a first bank positioned between the plurality of first electrodes adjacent in the column direction; and a second bank positioned between the plurality of first electrodes adjacent in the row direction, wherein the first sub-electrode has a convex part protruded toward the third sub-electrode that has a concave part corresponding to the convex part, wherein the second bank has second-first opening, second-second opening and second third opening, wherein the second-first opening exposes the first sub-electrode arranged in the (3n−2) column, the second-second opening exposes the second sub-electrode arranged in the (3n−1) column, and the second-third opening exposes the third sub-electrodes arranged in the 3n column, wherein the second-first opening, the second-second opening, and the second-third opening respectively have different areas and different shapes from one another, and wherein at least one of the second-first opening, the second-second opening, and the second-third opening of the second bank includes a first region having different widths and a second region having a same width.

2. The organic light-emitting display of claim 1, wherein the convex part of the first sub-electrode is inserted in the concave part of the third sub-electrode.

3. The organic light-emitting display of claim 1, wherein the plurality of subpixels comprises first, second and third subpixels, and the first, second and third sub-electrodes are respectively disposed in the first, second and third subpixels.

4. The organic light-emitting display of claim 3, wherein the first subpixel, the second subpixel and the third subpixels respectively include openings that have different areas and different shapes from one another.

5. The organic light-emitting display of claim 1, wherein the first bank has first openings that expose one first electrode; and the second bank is positioned over the first bank.

6. The organic light-emitting display of claim 1, wherein the second bank is extended in the column direction in a straight-line shape between the first sub-electrode arranged in the (3n−2) column and the second sub-electrode arranged in the (3n−1) column, wherein the second bank is extended in the column direction in the straight-line shape between the second sub-electrode arranged in the (3n−1) column and the third sub-electrode arranged in the 3n column, and wherein the second bank is extended in the column direction in a zigzag form between the third sub-electrode arranged in the 3n column and the second sub-electrode arranged in the (3n−2) column.

* * * * *